(12) United States Patent
Bagschik et al.

(10) Patent No.: US 11,767,030 B1
(45) Date of Patent: Sep. 26, 2023

(54) SCENARIO SIMULATION EXECUTION WITHIN A TRUNCATED PARAMETER SPACE

(71) Applicant: Zoox, Inc., Foster City, CA (US)

(72) Inventors: Gerrit Bagschik, Foster City, CA (US); Andraz Kavalar, San Francisco, CA (US); Anne-Claire Elisabeth Marie Le Henaff, San Francisco, CA (US)

(73) Assignee: Zoox, Inc., Foster City, CA (US)

( * ) Notice: Subject to any disclaimer, the term of this patent is extended or adjusted under 35 U.S.C. 154(b) by 239 days.

(21) Appl. No.: 17/207,451

(22) Filed: Mar. 19, 2021

(51) Int. Cl.
  *B60W 60/00* (2020.01)
  *G06V 20/56* (2022.01)
  *G06F 18/2415* (2023.01)

(52) U.S. Cl.
  CPC .... *B60W 60/0011* (2020.02); *B60W 60/0015* (2020.02); *G06F 18/24155* (2023.01); *G06V 20/56* (2022.01)

(58) Field of Classification Search
  None
  See application file for complete search history.

(56) References Cited

U.S. PATENT DOCUMENTS

| 2022/0019713 A1* | 1/2022 | Gyllenhammar ... B60W 30/095 |
| 2022/0153298 A1* | 5/2022 | Wang ..................... G06N 3/126 |

OTHER PUBLICATIONS

Au et al., "Estimation of small failure probabilities in high dimensions by subset simulation", 2001, Probabilistic Engineering Mechanics, vol. 16, No. 4, pp. 263-277 (Year: 2001).*

Alvarez et al., "Estimation of the lower and upper bounds on the probability of failure using subset simulation and random set theory", 2018, Mechanical Systems and Signal Processing, vol. 100, pp. 782-801. (Year: 2018).*

* cited by examiner

*Primary Examiner* — Tamara L Weber
(74) *Attorney, Agent, or Firm* — Lee & Hayes, P.C.

(57) ABSTRACT

Techniques are discussed herein for determining truncated simulation regions within a parameter space of simulation scenarios, such as driving scenarios used to analyze and evaluate the responses of autonomous vehicle controllers. Using non-sampling-based parameter selection techniques, parameterized scenarios may be executed as simulations to determine the truncated simulation region. Sampling-based parameter selection techniques may be used to determine additional parameterized scenarios, which may be compared to the truncated simulation region. Parameterized scenarios within the truncated simulation region may be executed as simulations and scenarios outside of the truncated simulation region may be excluded, and the aggregated results may be analyzed to determine scenario/vehicle performance metrics across the scenario parameter space.

20 Claims, 8 Drawing Sheets

SCENARIO SIMULATION EXECUTION WITHIN A TRUNCATED PARAMETER SPACE

BACKGROUND

Simulations can be used to test and validate the features and functionalities of systems, including those that may be otherwise prohibitive to test in real world environments for example, due to safety concerns, limitations on time, repeatability, etc. For example, autonomous vehicles may use driving simulations to test and improve the performance of the vehicle control systems with respect to passenger safety, vehicle decision-making, sensor data analysis, route optimization, and the like. However, driving simulations that accurately reflect real world scenarios may be difficult and expensive to create and execute, as the data used to create such simulations may be noisy, inconsistent, or incomplete. Additionally, execution of driving simulations may involve executing multiple different interacting systems and components, including the vehicle control systems being evaluated, as well as agents and other objects in the simulated environment, which may be resource and computationally expensive.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
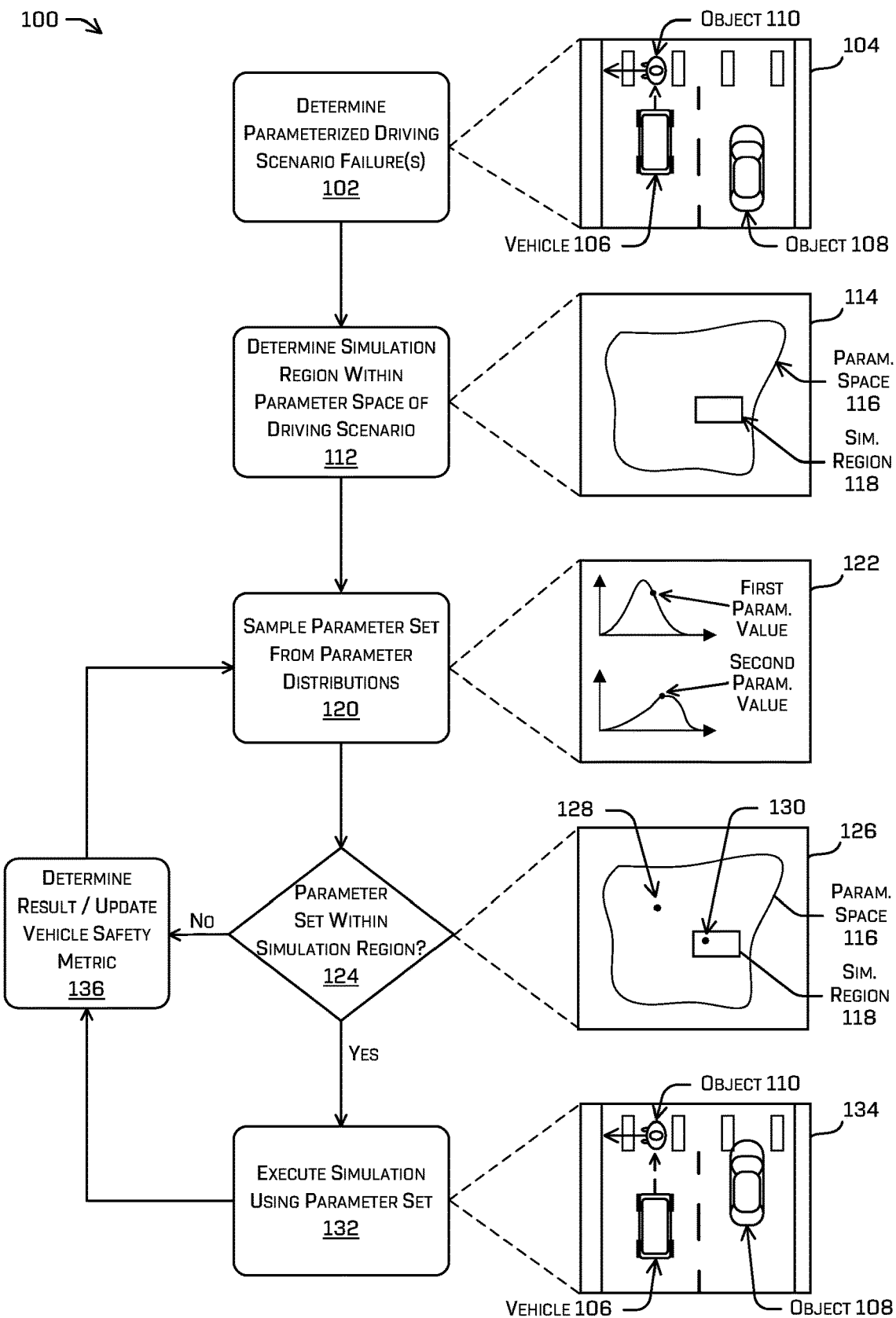
FIG. 1 illustrates techniques for determining a simulation region within the parameter space of a driving scenario, and using sampling-based techniques to determine and execute simulations within the simulation region, in accordance with one or more implementations of the disclosure.

The techniques discussed herein relate to executing and evaluating simulations based on parameterized scenarios. In various examples, simulations may include driving simulations in which an autonomous vehicle controller is executed within a parameterized driving scenario. During the execution of a driving simulation, the autonomous vehicle controller may interact with static and/or dynamic objects within a simulated environment. Within the context of driving scenario simulations and/or computer-based simulation systems, the techniques discussed herein include combining non-sampling-based parameter selection and sampling-based parameter selection techniques to determine a truncated simulation region for executing and evaluating simulations. In some examples, non-sampling-based parameter selection techniques may be used to determine one or more truncated simulation regions within a larger parameter space associated with a scenario. Sampling-based parameter selection techniques may be used to determine additional parameterized scenarios, which may be compared to the truncated simulation region to determine which of the parameterized scenarios are executed as simulations. In some examples, a sampling-based parameterized scenario may be executed when the scenario is within the simulation region, and may be excluded from a simulation operation when the scenario is outside of the simulation region. For a set of parameterized scenarios, the results from executed simulations may be aggregated with the expected results from non-executed simulations, and the aggregated results may be used to determine vehicle safety metrics and/or other scenario performance data for the scenario.

Certain techniques and examples described herein may provide technical advantages for executing and evaluating simulations, and in particular for detecting and quantifying events occurring infrequently during simulations. For example, during driving simulations in a scenario for an autonomous vehicle, interactions (e.g., collisions) between the simulated autonomous vehicle and other objects in the simulation may occur only rarely within the particular scenario. However, detecting and analyzing the collisions that occur in driving simulations is important for vehicle and passenger safety, both to determine the causes of the collisions, and to determine the remedial actions that can be taken by the autonomous vehicle to avoid the collisions in real-world driving scenarios. Additionally, detecting and analyzing collisions during driving simulations is important for accurately quantifying the probability of such collisions in order to determine vehicle and/or scenario safety metrics, assess driving risks, and improve vehicle safety during real-world driving conditions.

Conventional systems used to detect and quantify events occurring with simulations often use brute force techniques, during which parameterized scenarios are generated and executed as simulations, and then evaluated to determine if the event occurred during the simulation. However, generating and executing driving simulations requires significant computational resources and time, which makes detecting and quantifying rare events within simulations difficult and/or technically impractical. The less frequently that an event occurs during a simulation, such as collision during a driving simulation, the greater the number of simulations and the amounts of computing resources that will be required to detect occurrences of the event. Additionally, as fewer occurrences of the event are detected using sampling-based techniques for generating and executing simulations, the resulting probability calculations for the event are less reliable.

In contrast to conventional systems that use brute force sampling to generate, execute, and evaluate parameterized scenarios, the techniques described herein may improve the detection of events occurring infrequently during simulations, and also may improve the probability calculations used to quantify the likelihood of such events. For instance, by using non-sampling techniques to determine a truncated simulation region within the parameter space of a scenario, various examples described herein may have improved success rates for detecting infrequent events during simulations. Additionally, by comparing the truncated simulation region to additional parameter sets generated using sampling techniques, the systems and components described herein may selectively execute simulations and exclude others, resulting in more accurate probability calculations for the simulations events.

The techniques described herein may be implemented in a number of ways. Example implementations are provided below with reference to the following figures. Although certain examples are discussed in the context of detecting events such as vehicle collisions within driving simulations, in other examples, the methods, devices, systems, computer-readable media, and/or other implementations described herein may be applied to a variety of other environments, such as utilization to detect other types of events occurring within simulations involving semi-autonomous or non-autonomous vehicles, and/or within aviation or nautical contexts, as well as detecting and analyzing events in other software-based simulation contexts.

FIG. 1 depicts an example process 100 of determining a simulation region within the parameter space of a driving scenario, and using sampling-based parameter selection techniques to determine and execute simulations within the simulation region. Some or all of the operations in process 100 may performed by components of a simulation system and/or computing devices, described below in more detail.

As noted above, the techniques described herein relate generally to executing and evaluating simulations based on scenarios. A scenario may refer to a defined environment in which may simulation may be executed. For example, a driving scenario may correspond to a particular driving environment through which a vehicle may traverse, and may include other vehicles and/or other static or dynamic objects with which the vehicle may interact. In some cases, driving scenarios may be based on log data collected by a real (or simulated) vehicles traversing through real (or simulated) environments. Such scenarios may comprise substantially similar (e.g., within technical tolerances) representations of the previously captured scenario from a log, perturbations thereof, or scenarios derived therefrom (e.g., representative scenarios determined from a plurality of scenarios). Driving scenarios may include, as non-limiting examples, intersection scenarios, crosswalk scenarios, freeway merging scenarios, bumper-to-bumper traffic scenarios, parallel parking scenarios, and so on.

A simulation system may use driving scenarios used to test and validate autonomous vehicle controllers and/or other components of the simulated autonomous vehicle as may be contemplated (e.g., braking capacity, energy dissipation, etc.). Each unique driving scenario may be stored as scenario data that defines a driving simulation environment (e.g., map data, road configurations and interactions, lighting conditions, weather conditions, traffic signs and signals, etc.), as well as the static and/or dynamic objects to be rendered in the simulation environment. Within a simulation based on a driving scenario, a simulated vehicle instantiated and controlled by an autonomous vehicle controller may traverse the driving simulation environment, and may encounter and react to dynamic objects (e.g., vehicles, pedestrians, animals, bicycles, etc.) and/or static objects (e.g., buildings, signage, parked vehicles, and the like) within the simulated environment.

The scenario data associated with a driving scenario may include a set of base (or default) parameters for the simulated vehicle and/or any other objects in the scenario. For example, for any vehicle and/or other object in a driving scenario, the scenario data may define base parameters (which also may be referred to as attributes) for the position (e.g., x, y, and/or z coordinates), orientation (e.g., a roll, pitch, yaw), velocity, acceleration, pose, and/or extent (or size) of the vehicle or object. Of course, any other parameter which defines a state of the vehicle is contemplated.

Additionally, in some examples a driving scenario may include scenario parameters that can be configured to modify (or perturb) the base parameters of a vehicle or object in the scenario, in order to introduce variation and inconsistency into the simulations executed based on the scenario. A scenario parameter associated with a parameter of a vehicle or other object in a scenario may be used to perturb the parameter from its base value to a perturbed value. Scenario parameters can increase or decrease base parameter values, by an absolute amount or by a percentage. In some examples, the scenario parameters may be determined from the base parameter values using parameter ranges and/or distributions associated with the corresponding object/vehicle parameters. For example, for an object in a scenario traveling at a speed of 10 meters per second (m/s), a parameter range of +/−40% associated with the velocity of the object may result in parameters ranging from −4 m/s to +4 m/s, and perturbed velocity values ranging between 6 m/s and 14 m/s for the object. Additionally, parameters may be determined based on distributions associated with their respective object parameters, in which the distributions determine the likelihood of different parameter values within the range. Continuing the above example, if the velocity parameter for a scenario object is defined by a normal distribution, then by sampling from the normal distribution the parameter values near the center of the distribution (e.g., 0 m/s) may be more likely than the parameter values near the tails of the distribution (e.g., −4 m/s and +4 m/s). Therefore, when sampling from the normal distribution defined for the object velocity, perturbed velocities closer to the base parameter value (e.g., 10 m/s) may be observed more often than perturbed velocities closer to the boundaries of the parameter range (e.g., 6 m/s and 14 m/s).

Although the above example describes using a parameter range and/or distribution to determine parameter values for perturbing the velocity of an object in a scenario, in other examples parameter ranges and/or distributions may be used to determine parameter values associated with any other parameter of a vehicle or other object within a scenario. In some cases, a parameter of an object in a scenario (e.g., an object position, extent, pose, velocity, acceleration, etc.) may have a unique parameter range and/or distribution defined for that parameter. Additionally or alternatively, a scenario may use the same parameter ranges and/or distributions for the same parameters and/or the same types of objects. For instance, in a scenario all vehicle objects may be assigned the same size parameter ranges (e.g., +/−N %) and similar distribution curves, the same position parameter ranges (e.g., +/−N meters) and similar distribution curves, the same acceleration parameter ranges and similar distribution curves, and so on for each different object type/classification. Additional parameters may control, for example, a number of objects, types of objects, characteristics of a map (e.g., lane widths, speed limits, etc.), or any other representation for reproducing an interaction of the autonomous vehicle in an environment.

When a simulation system executes a simulation based on a driving scenarios, it may use the base parameter values for the objects in the scenario, and/or may use object parameter values perturbed using scenario parameters. For example, for a scenario parameter associated with a particular parameter of a particular object in the scenario, a parameter component can determine a parameter value and/or percentage associated with the parameter. When executing the simulation, a simulation component may instantiate and simulate the responses of the autonomous vehicle controller to the simulated environment, including simulated vehicles and/or objects having perturbed parameters based on their respective scenario parameters. As noted above, the scenario parameters for an object parameter in a scenario may be based on a parameter range and/or distribution for the object parameter. In some cases, the parameter ranges and/or distributions may be based on perception error models associated with the object parameters. Such error models may be represented by, without limitation, look-up tables determined based on statistical aggregation using ground-truth data, functions (e.g., errors based on input parameters), or any other model which maps a parameter to a particular error. In at least some examples, such error models may map particular errors with probabilities/frequencies of occurrence. For example, details of using error models and/or distributions to evaluate risk or probability of collisions are discussed in U.S. application Ser. No. 16/862,693, filed on Apr. 30, 2020, and titled "Constructing Vehicle Operation Based on Uncertainty in Perception and/or Prediction," which is herein incorporated by reference in its entirety.

A parameterized scenario may refer to scenario in which one or more parameters of the vehicles/objects in the scenario has been perturbed based on a parameter associated with the parameter. Parameterized scenarios can be generated based on an initial (or based) driving scenario, by determining a set of parameter values that can be used to perturb one or more object parameters of the base scenario. Parameterized scenarios can provide a set of variations of the base scenario, by determining multiple parameter sets to efficiently cover a wide range of variations of the scenario without requiring a manual enumeration of the variations. Additionally, based at least in part on executing the parameterized scenarios, simulation data (e.g., simulation results) can indicate how the autonomous vehicle controller responded to (or will respond to) the various parameterized scenarios and determine a successful outcome or an unsuccessful outcome based at least in part on the simulation data.

In some cases, the simulation results for a set of parameterized scenarios can be aggregated to provide safety metrics associated with the autonomous vehicle controller and/or the parameterized scenario. For example, the simulation data can indicate a success rate and/or a failure rate of the autonomous vehicle controller with respect to the parameterized scenario. In some instances, meeting or exceeding a success rate can indicate a successful validation of the autonomous vehicle controller which can subsequently be downloaded by (or otherwise transferred to) a vehicle for further vehicle control and operation.

Within process 100, at operation 102 a simulation system determines one or more failures of parameterized scenarios associated with a driving scenario. In some examples, determining a failure of a parameterized scenario may be based on executing and evaluating the results of a simulation. Such a failure may be defined, for example, based on certain policies, constraints, or the like. Further, such failures may not necessarily be binary (e.g., failure or not), but may be continuous (e.g., a degree of failure), or otherwise bucketed into a severity of the failure. For instance, box 104 depicts the execution of a driving simulation based on a parameterized scenario. In this example, a simulated vehicle 106 controlled by an autonomous vehicle controller traverses through a simulated environment including two other objects. Object 108 is another vehicle in this example, and object 110 is a pedestrian crossing a crosswalk. In this example, if the simulated vehicle 106 contacts (e.g., collides with) either the pedestrian (objects 110) or the other vehicle (object 108) during the simulation, then the simulation system may classify the simulation as a failure of the driving scenario. In other examples, a driving scenario may have failure conditions other than a collision. For instance, the simulation system may classify the simulation as a scenario failure if the simulated vehicle 106 comes within a threshold distance (e.g., a safety region) of another object, if simulated vehicle 106 violates a traffic law, or if the simulated vehicle 106 is forced to brake or steer at greater than a threshold rate to avoid a collision, etc. In this example, the simulation depicted in box 104 has been classified as a parameterized scenario failure, based on a determination that the simulated vehicle 106 contacted the pedestrian (object 110) after being partially occluded by the other vehicle (object 108) while approaching the intersection.

In some examples, a non-sampling-based search algorithm may be used to determine parameterized scenario failures in operation 102. For instance, the simulation system may use a Bayesian optimization technique to execute and classify series of simulations using different parameter sets for the driving scenario. When using a Bayesian optimization technique, the simulation system initially may select one or more sets of scenario parameters during an initialization phase of the Bayesian algorithm. The scenario parameter sets selected during the Bayesian initialization phase may be selected systematically or at random, to provide the algorithm with sufficient known of the underlying system to be emulated. As noted above, each scenario parameter may represent a parameter value (e.g., an extent value, position value, pose value, velocity value, acceleration value, etc.) for an object within the driving scenario. The simulation system then may execute the parameterized driving scenario to determine a simulation result and/or outcome. For example, in the simulation depicted in box 104, the driving scenario can represent a simulated vehicle 106 controlled by an autonomous vehicle controller traveling at a speed and performing a stop action before the pedestrian (object 108) crossing in the crosswalk. The scenario parameters may control the initial position speed, trajectory, acceleration, and/or pose of the simulated vehicle 106, the pedestrian, and/or any other objects in the simulated environment. Multiple parameter sets may be used to execute multiple simulations using different combinations of the object parameters, such as different speeds, positions, and trajectories within the parameter ranges for each parameter and for each object. In this example, the parameterized scenario can be executed as a simulation and associated with an outcome indicating the minimum distance between the simulated vehicle 106 and the pedestrian during the simulation. A minimum distance of zero may indicate that the simulated vehicle 106 contacted the pedestrian during the simulation, representing a parameterized scenario failure, while a non-zero minimum distance may represent a successful parameterized scenario.

Continuing with the Bayesian optimization technique, after the initialization phase the Bayesian algorithm may use non-random techniques to select parameter sets for driving scenario simulations. After each driving simulation is executed the simulation system may provide the simulation results (e.g., pass or fail) and/or outcome(s) for the parameterized scenario (e.g., minimum distance between the simulated vehicle and object during the simulation) to a non-sampling parameter selection component configured to implement a Bayesian optimization algorithm. The parameter selection component may use Bayesian optimization to determine parameter sets for subsequent simulations of the driving scenario. The selection of the parameter sets may be determined by the Bayesian optimization algorithm to both explore and exploit the multidimensional parameter space of the scenario. In this example, exploring the parameter space may refer to selecting parameter sets with a high level of uncertainty of the simulation outcome(s). For instance, during exploration the Bayesian optimization algorithm may select parameter sets far from the parameter sets of previously executed simulations within the parameter space, to escape any local maxima/minima and determine simulation outcome(s) for other regions of the parameter space. In contrast, exploiting the parameter space may refer to selecting parameter sets with high likelihood of identifying a parameterized scenario failure. For instance, during exploitation the Bayesian optimization algorithm may select a parameter set near another parameter set used in a simulation that had a low minimum distance between the simulated vehicle and object (e.g., a near-miss collision). In other words, parameter selection based on exploitation may use the parameter sets of existing scenario failures and/or near failures, to maximize the probability of selecting other points in the parameter space that correspond to scenario failures.

Although certain examples described herein use a Bayesian optimization algorithm to select parameter sets, in other examples other machine learning algorithms configured for black box optimization may be used instead of or in addition to Bayesian optimization. As noted above, Bayesian optimization and/or other machine learning algorithms may be non-sampling-based techniques in some cases. As used herein, anon-sampling-based technique for selecting scenario parameters may include techniques in which parameters are selected without regard to parameter error models or other parameter probability distributions based on vehicle log data from real or simulated driving scenarios. For instance, in a parameter probability distribution (or parameter distribution) based on error models and/or other real-world driving data, a sampling-based technique may select parameters near the mean more often than parameters near the tails of the distribution. In contrast, a non-sampling-based technique would select parameter sets throughout the parameter space without regard to parameter distributions and without biasing in favor of parameter value nearer the mean of the distribution.

Additionally, in some examples determining parameterized scenario failures in operation 102 may use other techniques that do not involve executing driving simulations. For instance, a parameterized scenario failure may be based on log data collected by a real vehicle traversing a real environment, when a collision (or other scenario failure condition) occurs for the real vehicle. In still other examples, parameterized scenario failures may be determined by manual or automated analyses of the software code of the autonomous vehicle controller. For instance, known errors or vulnerabilities in the software code may be discovered and targeted by selecting particular scenario parameter sets that may expose the software errors or vulnerabilities.

At operation 112, the simulation system determines a simulation region within the parameter space of the driving scenario. The parameter space associated with a driving scenario may correspond to a multidimensional space having a separate dimension for each parameter of the scenario that may be modified from a base parameter value to an updated/perturbed parameter value. For instance, if a driving scenario includes three objects, and three different parameters may be perturbed for each object (e.g., the position, velocity, and acceleration), then the parameter space for the driving scenario may be nine (9) dimensional. For each dimension in a parameter space, the length and/or size of the dimension may be based on the parameter range of the associated parameter. For instance, a position parameter of an object that may be perturbed within the range from −5 meters to 5 meters, and includes a parameter increment of 0.1 meters, the parameter range for the parameter may include 100 possible parameter values. As another example, for a separate velocity parameter of the object that may be perturbed between −25% and 25% of the object's base velocity, and includes a parameter increment of 1% velocity, the parameter range for the parameter may include 50 possible parameter values.

Box 114 depicts an example representation of a parameter space 116 associated with a driving scenario. Although the parameter space 116 is shown as a two-dimensional form, parameter spaces for driving scenarios may include any number (e.g., tens or hundreds) of dimensions in other examples. In various implementations, the parameter space 116 may be a multidimensional geographic structure including a fixed parameter range for each dimension, or may be a freeform structure in which the parameter ranges are related and may vary based on the parameter values in other ranges.

A simulation region 118 is also depicted with the parameter space 116. As described below in more detail, a simulation region component may determine the simulation region based on the parameter sets of the driving scenario failures identified in operation 102. For example, the simulation region may be a continuous multidimensional region within the parameter space that encompasses at least the parameter sets of the driving scenario failures identified in operation 102. In some cases, at least two driving scenario failures may be required before a simulation region is determined. To illustrate a simple example using a two-dimensional parameter space, assume that two parameterized scenarios resulted in a failed simulations were detected in operation 102. The first parameterized scenario in this example may have a first parameter value of 2.5 meters and a second parameter value of 15 degrees, and the second parameterized scenario may have a first parameter value of 3.3 meters and a second parameter value of −4 degrees. In this example, the simulation region 118 may be determined as the region within the parameter space 116 defined by a first parameter subrange from 2.5 to 3.3 meters, and a second parameter subrange from −4 to 15 degrees. As noted above, parameter spaces may have many more dimensions in other examples, and a simulation region may include any number of dimensions up to and including the same number of dimensions as the parameter space containing it.

At operation 120, the simulation system may use a sampling-based technique to determine a set of parameters for the driving scenario, based on one or more parameter distributions. Box 122 shows example probability distributions representing two different parameters, including a sampled value for each scenario parameter. In some examples, the sampled values may correspond to a single sample from a multi-dimensional joint distribution of the scenario parameters, in which the single sample includes probability-based dependent parameter values for each of the scenario parameters. These sample values, taken together, may correspond to a sampled parameter set for the driving scenario. As discussed above, the parameter distributions (e.g., a multi-dimensional joint distribution or multiple individual parameter distributions) may be based on vehicle perception error models and/or other real-world driving data, and thus the parameter sets sampled in operation 120 are more likely to reflect scenario parameters similar to those encountered in real-world driving situations. For instance, a sampled parameter value in operation 120 that is used to perturb a base parameter for an object's position, velocity, acceleration, size, pose, etc., is more likely to be selected from nearer the mean of the distribution, and thus may occur relatively more often in real-world driving situations than parameter values selected from nearer the tails of the distribution.

At operation 124, the simulation system compares the sampled parameter set from operation 120 to the simulation region determined in operation 112. As noted above, the simulation region may be defined by a set of subranges for each parameter of the parameter space. To determine whether a parameter set is within the simulation region, each parameter value in the parameter set may be compared to the corresponding parameter subrange of the simulation region. For example, box 126 depicts the parameter space 116 and simulation region 118 described above, as well as two parameter sets 128 and 130. Using the above example, if the simulation region 118 is defined by a first parameter subrange of 2.5 to 3.3 meters, and a second parameter subrange of −4 to 15 degrees, then a parameter set 128 having parameter values of {3.1 meters, 18 degrees} or {1.7 meters, 7 degrees} would not be within (e.g., would be outside) the simulation region 118. In contrast, a parameter set 130 having parameter values of {3.1 meters, 18 degrees} would be within the simulation region 118.

When a sampling-based parameter set determined in operation 120 is within the simulation region (124:Yes), then in operation 132 the simulation system may execute a simulation based on the parameterized scenario. For example, box 134 depicts the execution of a simulation based on the same driving scenario depicted in box 104. The simulation depicted in box 134 shows the same simulated vehicle 106 and objects 108 and 110. However, due to the sampling-based scenario parameters selected in this example, certain object parameters are different from those in the simulation depicted in box 104. For instance, in box 134 the parameterized scenario uses a different position and velocity for the simulated vehicle 106, and a different position for the object 108. Although this example describes executing a simulation directly in response to determining in operation 120 that the sampling-based parameter set is within the simulation region (124:Yes), in other examples the simulation depicted in box 134 need not be executed immediately. For instance, in some cases the simulation system may set aside a number of parameter sets identified within the simulation, and may execute a batch of simulations when the number of parameter sets reaches a threshold.

After the execution of the simulation in operation 132, in operation 136 the simulation system may determine a simulation result, and may update one or more performance metrics associated the driving scenario based on the simulation result. In some cases, the simulation result may correspond to a binary (e.g., pass or fail) result, and the performance metrics may be updated to indicate the pass or fail of the simulation representing the parameterized scenario. For instance, based on the simulation the depicted in box 134, the simulation system may classify the parameterized scenario as failing if the simulated vehicle 106 contacts the pedestrian object 110 during the simulation, and may classify the parameterized scenario as passing if the simulated vehicle 106 does not contact the pedestrian object 110. In this example, the performance metric for the driving scenario may correspond to a collision probability or other vehicle safety metric. However, in other examples, driving simulations need not output pass/fail results, but may output various other types of results and/or outcome data. In such examples, the simulation system may use any result criteria or combination of criteria to evaluate the simulation results and update the performance metrics associated the driving scenario.

In contrast, when a sampling-based parameter set determined in operation 120 is outside the simulation region (124:No), then process 100 may proceed to operation 136 to determine and update the performance metrics associated the driving scenario. Therefore, in this example, when the parameter set is outside the simulation region the simulation system does not execute a simulation based on the parameterized scenario. Instead, the simulation system may determine an expected result for the parameterized scenario, without generating or executing a simulation based on the parameterized scenario. The expected result for the parameterized scenario may correspond to a likely or probable result/outcome of a simulation, if a simulation were to be executed for the parameterized scenario. In this example, because the parameter set determined in operation 120 is outside the simulation region 118, the simulation system may assume that a simulation based on the parameterized scenario would pass. Therefore, in operation 136 the simulation system may update the performance metric (e.g., vehicle safety metric) for the driving scenario to indicate an expected passing simulation result.

As illustrated by operations 124, 132, and 136, process 100 describes a technique in which the subset of sampling-based parameterized scenarios within the simulation region are executed as simulations, and the other subset of sampling-based parameterized scenarios outside of the simulation region are not executed as simulations. This technique may provide technical advantages when evaluating large numbers of parameterized scenarios, both by reducing the amount of computing resources required by the simulation system, and by improving the accuracy of the performance metrics (e.g., a collision metric, vehicle safety metric, etc.) associated with the driving scenario, thereby improving the safety of autonomous vehicles in operation.

The technical advantages and improvements provided by the techniques described herein are based in part on the greater degree of uncertainty of simulation results based on parameterized scenarios within the simulation region. As described herein, the simulation region may be determined specifically to encompass known failures of parameterized scenarios, for driving scenarios in which failures may be infrequent. Therefore, additional sampling-based parameterized scenarios that fall within the same simulation region may have a higher likelihood of simulation failure, as well as a greater degree of uncertainty about the simulation result. In contrast, sampling-based parameterized scenarios that are outside of simulation region may have a lower likelihood of simulation failure, as well as low uncertainty about the simulation result. The techniques described herein leverage these discrepancies in simulation result uncertainly by performing simulations only for parameterized scenarios within the simulation region, and using expected results for parameterized scenarios outside of the simulation region. As a result, the techniques herein save computing resources within the simulation system by not generating and executing simulations that have a higher degree of result certainty and are very likely to pass. Additionally, the simulation system generates and executes more simulations within the simulation region whose results are less certain, thereby providing more relevant result data and improved accuracy for the scenario performance/vehicle safety metrics.

Certain examples described herein include determining a simulation region that encompasses one or more failures of parameterized scenarios, within a larger parameter space that has relatively few scenario failures overall. However, in other examples, this technique may be inverted to achieve some or all of the same technical advantages and improvements. For instance, in a parameter space for a driving scenario having a relatively large number of failures, a simulation region may be determined to that encompasses a discrete number of passing results for parameterized scenarios. In such examples, the expected simulation result of any parameterized scenarios outside of the simulation region may be a failing result.

Additionally or alternatively, in some cases the techniques described herein may be used to determine and evaluate multiple non-overlapping simulation regions within a single parameter space for a driving scenario. Determining and using multiple simulation regions may provide advantages when determining that the parameter space has discrete regions of greater simulation result uncertainty (e.g., more scenario failures) that are positioned far from each other in the parameter space. In such examples, a sampling-based parameter set may be compared to each of the discreet and non-overlapping simulation regions, and a simulation may be executed for the parameterized scenario when the parameter set falls within any of the simulation regions.

Figure 2:
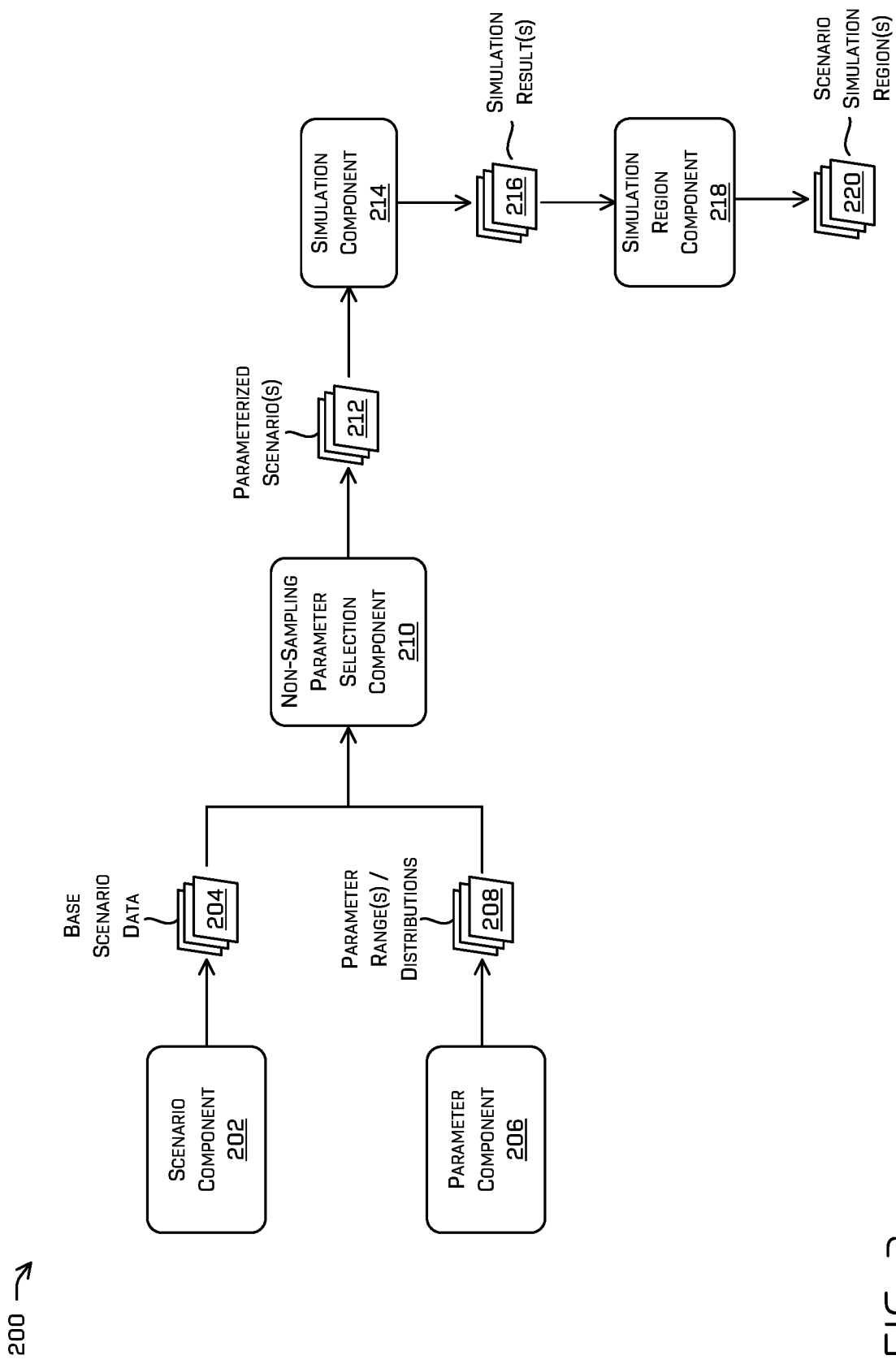
FIG. 2 illustrates components of an example system for determining a simulation region based on parameterized scenarios determined using non-sampling techniques, in accordance with one or more implementations of the disclosure.

FIG. 2 is an example system 200 including components configured to determine a simulation region associated with a driving scenario. As described below, example system 200 uses non-sampling-based parameter selection techniques to determine and execute simulations based on parameterized scenarios of a driving scenario. The example system 200 then may use the simulation results to determine simulation region associated with a driving scenario.

The scenario component 202 may be configured to select and/or generate base scenario data 204 associated with a driving scenario. As described above, the base scenario data 204 for a driving scenario may data defining a simulated driving environment, a simulated vehicle, and/or other vehicles, static objects, and dynamic objects with which the simulated vehicle may interact in the simulated driving environment. In some cases, the scenario component 202 may generate driving scenarios based on log data and/or additional input data. For instance, the scenario component 202 may use log data collected by a real or simulated vehicle traversing through a real or simulated environment, along with additional input data such as image data captured by the vehicle sensors or a dashboard camera, third-party data such as police incident reports, image data from traffic cameras, map data, etc. Based on the log data and/or input data, the scenario component 202 may generate a driving scenario including a synthetic environment that represents at least a portion of the log data/input data. Examples of generating base scenario data 204 for driving scenarios based on input data and/or log data can be found, for example, in U.S. patent application Ser. No. 16/392,094 titled "Scenario Editor and Simulator" and filed Apr. 23, 2019 which is incorporated by reference in its entirety.

In some examples, the scenario component 202 may scan the simulated environment and/or objects to determine object classifications (e.g., vehicles, bicycles, pedestrians, etc.) and scenario actions (e.g., crossing a street without a right-of-way, changing lanes, jaywalking, stopping at an intersection, and the like). The scenario component 202 can identify specific objects and scenario actions and label (and/or categorize) the objects and actions within the base scenario data 204. In some instances, the scenario component 202 can receive label data from a user of the scenario component 202 and/or other external system to associate portions of driving scenario with labels in the base scenario data 204. In some instances, the scenario component 202 can generate a library of different driving scenarios, including base scenario data 204 for each scenario, and may store the library of driving scenarios in a database. By way of example and without limitation, the library of scenarios can include crosswalk scenarios, merging scenarios, lane change scenarios, and the like. In at least some examples, the base scenario data 204 may be manually specified. For example, one or more users may designate certain scenarios to be tested to ensure that the vehicle is capable of safely operating when performing such scenarios, despite having never (or rarely) previously encountered the scenario.

The parameter component 206 may be configured to determine scenario parameters, including base parameter values and/or perturbed parameter values that have been updated from the base parameters using absolute or relative parameter offsets, for the driving scenarios in the base scenario data 204. In some examples, the base scenario data 204 may include a base (or default) set of parameters for any or all objects in the driving scenario. Additionally or alternatively, the base parameters for the objects in the driving scenarios of the base scenario data 204 may be determined by the parameter component 206. As discussed above, the parameters of an object within a driving simulation may include, without limitation, the position, size, velocity, acceleration, trajectory, yaw, and/or pose of the object. The parameter component 206 may determine parameter data 208 (e.g., parameter values, ranges, and/or distributions) associated with any of the parameters of the scenario objects. As noted above, parameter values may be used to perturb the base parameter values for scenario objects, to determine or generate parameterized scenarios.

In some examples, the parameter component 206 may analyze the base scenario data 204 for a driving scenario and determine base and/or perturbed parameters associated with the scenario. For the simulated vehicle and each object in the scenario, the parameter component 206 may determine a position of the object, a pose of the object, a size of the object, a velocity of the object, a track of the object, a distance between object and the simulated vehicle or any other object, and the like. The parameter component 206 also can determine parameter data 208 including ranges and/or set of values associated with each base scenario parameter. For example, the parameter component 206 can determine a classification (e.g., vehicle, pedestrian, bicycle, etc.) associated with each object represented in the base scenario data 204, and can determine a parameter range of values associated with the scenario parameter as represented by the base scenario data 204. As non-limiting examples, the parameter range for a pedestrian object can indicate that the pedestrian can have a velocity with a range of 0.5-1.5 m/s. For a vehicle object, the parameter range may indicate that the vehicle can have a velocity within a relative range (e.g., +/−30% of the base object velocity) or within an absolute range (e.g., 5 m/s of the base object velocity).

In some instances, the parameter component 206 also may determine a probability associated with a scenario parameter. By way of example and without limitation, the parameter component 206 may associate a probability distribution such as a Gaussian distribution (also referred to as a normal distribution) with the scenario parameter. In some instances, the parameter component 206 can determine the probability associated with the scenario parameter based on log data collected by a vehicle, perception error data, and/or various other input data. As discussed above, the parameter component 206 can determine a classification associated with an object represented in a driving scenario, and can determine other objects of the same classification within log data, base scenario data for other driving scenarios, and/or other input data. Then the parameter component 206 can determine the probability distributions of various scenario parameters using the log data, base scenario data, and/or other input data. As noted above, the probability distributions may be normal Gaussian distributions in some examples. In other examples, the probability distribution for any scenario parameters including the size, position, velocity, pose, and the like for any object in a driving scenario, may include any normal or non-normal distribution, including unimodal, bimodal, and/or multi-modal distributions.

As an example, the parameter component 206 may determine that 30% of pedestrians walk at a velocity below 0.3 meters per second, 30% of pedestrians walk at a velocity above 1.2 meters per second, and that 40% of pedestrians walk at a velocity between 0.3 and 1.2 meters per second. In this example, the parameter component 206 may use the distribution as a probability that a pedestrian in a crosswalk or jaywalking scenario will walk at a particular velocity. In some instances, the parameter component 206 can receive supplemental data that may be incorporated into a distribution for one or more scenario parameters. For instance, the parameter component 206 can determine scenario parameters indicating that a pedestrian can have a distance with a range of 30-60 meters to a vehicle while the vehicle travels at a velocity of 15 m/s or alternatively represented as a time-to-collision of 2-4 seconds. In this case, a regulation or guideline may indicate that the vehicle must handle scenarios with a 1.5 second time-to-collision which can be a lower bound (also referred to as a parameter threshold). The parameter component 206 can incorporate the regulation or guideline and determine a scenario parameter as having a 1.5 to 4.0 second time-to-collision (although any time range can be specified).

A non-sampling parameter selection component 210 may receive the base scenario data 204 and associated parameter data (e.g., parameter ranges), and may determine parameter sets for the scenario using non-sampling techniques. A parameter set may include a parameter value associated with each parameter in the driving scenario. As an example, a particular driving scenario may have two modifiable parameters associated with the simulated vehicle (e.g., position and velocity), and three other modifiable parameters associated with another object in the scenario (e.g., position, trajectory, and acceleration). In this example, the driving scenario may have five modifiable parameters in total, and a parameter set selected for the driving scenario may have five parameter values, one for each of the scenario parameters. As noted above, the parameter set in this example may be represented as a point in a five-dimensional parameter space.

The non-sampling parameter selection component 210 in this example may use any combination of non-sampling techniques to select a parameter set for the scenario. In some examples, a Bayesian optimization algorithm and/or other machine learning algorithms configured for black box optimization may be used to select a parameter value for each parameter in the set. As discussed above, non-sampling techniques for selecting scenario parameter sets may include selecting the values for a parameter without regard to the probability distribution of that parameter. Parameter probability distributions may be based on error models and/or other real-world driving data, so that sampling-based techniques are likely to select values from the probability distribution that more realistically model real-world driving data. In contrast, the non-sampling parameter selection component 210 in this example may be selected from anywhere within the parameter range, without weighting to select more samples near the distribution mean(s).

After using a non-sampling technique to select a set of parameters for a driving scenario, the non-sampling parameter selection component 210 can use the set of parameters to modify the base scenario data 204, to generate a parameterized scenario 212. The parameterized scenario 212 can include the simulated environment and objects represented in the base scenario data 204, along with the selected scenario parameters to determine the positions, speeds, accelerations, and poses of the scenario objects, and the like. In some examples, a scenario parameter may be associated with a particular object in the scenario, and may specify a value for a parameter (or attribute) of the particular object. Parameter values for object position, size, velocity, acceleration trajectory, pose, and the like, may be determined and stored absolute values, or offset values or percentages with respect to a base parameter value. Additionally or alternatively, the parameters in a parameterized scenario 212 may correspond to relative data between different objects in the scenario, such as relative distances, relative velocities, and/or relative yaws between any pair of objects in the scenario.

The simulation component 214 can execute a parameterized scenario 212 as a set of simulation instructions and generate simulation results 216 (and/or other simulation outcome data). For example, the simulation component 214 can instantiate a vehicle controller in the simulated scenario. In some instances, the simulation component 214 can execute multiple simulated scenarios simultaneously and/or in parallel. Additionally, the simulation component 214 can determine the results/outcomes for the parameterized scenario 212. For example, the simulation component 214 may generate the simulation results 216 indicating how the autonomous vehicle controller performed (e.g., responded), and may compare the simulation results 216 to a predetermined outcome and/or determine if any predetermined rules/assertions were broken/triggered.

In various examples, the predetermined rules/assertions can be associated with the driving scenario upon which the parameterized scenario 212 is based. Such rules/assertions for the parameterized scenario 212 may include rules regarding avoiding collisions, maintaining safety regions, obeying speed limits or other traffic rules, responding safely to particular situations, etc. In some instances, the rules/assertions can include comfort metrics that relate to, for example, how quickly the simulated vehicle or other object can accelerate within the simulated driving scenario.

Based at least in part on determining that the autonomous vehicle controller performed consistent with the predetermined outcome (that is, the autonomous vehicle controller did everything it was supposed to do) and/or determining that a rule was not broken or an assertion was not triggered, the simulation component 214 can determine that the autonomous vehicle controller succeeded for the parameterized scenario 212. In contrast, based at least in part on determining that the autonomous vehicle controller performance was inconsistent with the predetermined outcome (that is, the autonomous vehicle controller did something that it wasn't supposed to do) and/or determining that a rule was broken or than an assertion was triggered, the simulation component 214 can determine that the autonomous vehicle controller failed for the parameterized scenario 212. Accordingly, based at least in part on executing the parameterized scenarios 212 as a driving simulations, the simulation results 216 can indicate how the autonomous vehicle controller responded during each simulation, and determine a successful or unsuccessful simulation result 216 based for each variation of the parameterized scenario 212 based on scenario parameters selected by the non-sampling parameter selection component 210.

The simulation region component 218 may use a number of simulation results 216 based on executed simulations for parameterized scenarios 212, to determine a simulation region(s) 220 associated with the driving scenario. As discussed above, a simulation region 220 may be a subregion within the parameter space associated with the driving scenario. Both the parameter space and the simulation region may be continuous multidimensional regions, in which each scenario parameter corresponds to a dimension within the parameter space and simulation region. The parameter space may be a larger region based on the parameter ranges for each scenario parameter, while the simulation region may be a smaller region contained within the parameter space and based on a subrange associated with each of the parameter ranges.

The simulation region component 218 may determine the simulation region 220 for the driving scenario based one or more failing parameterized scenarios. For example, the simulation region component 218 may analyze the simulation results 216 (and/or other simulation outcomes) to identify one or more of the parameterized scenarios 212 that resulted in a failing simulation. Then, the simulation region component 218 may determine a simulation region 220 that encompasses the parameter sets of the failing parameterized scenarios 212.

Figure 3:
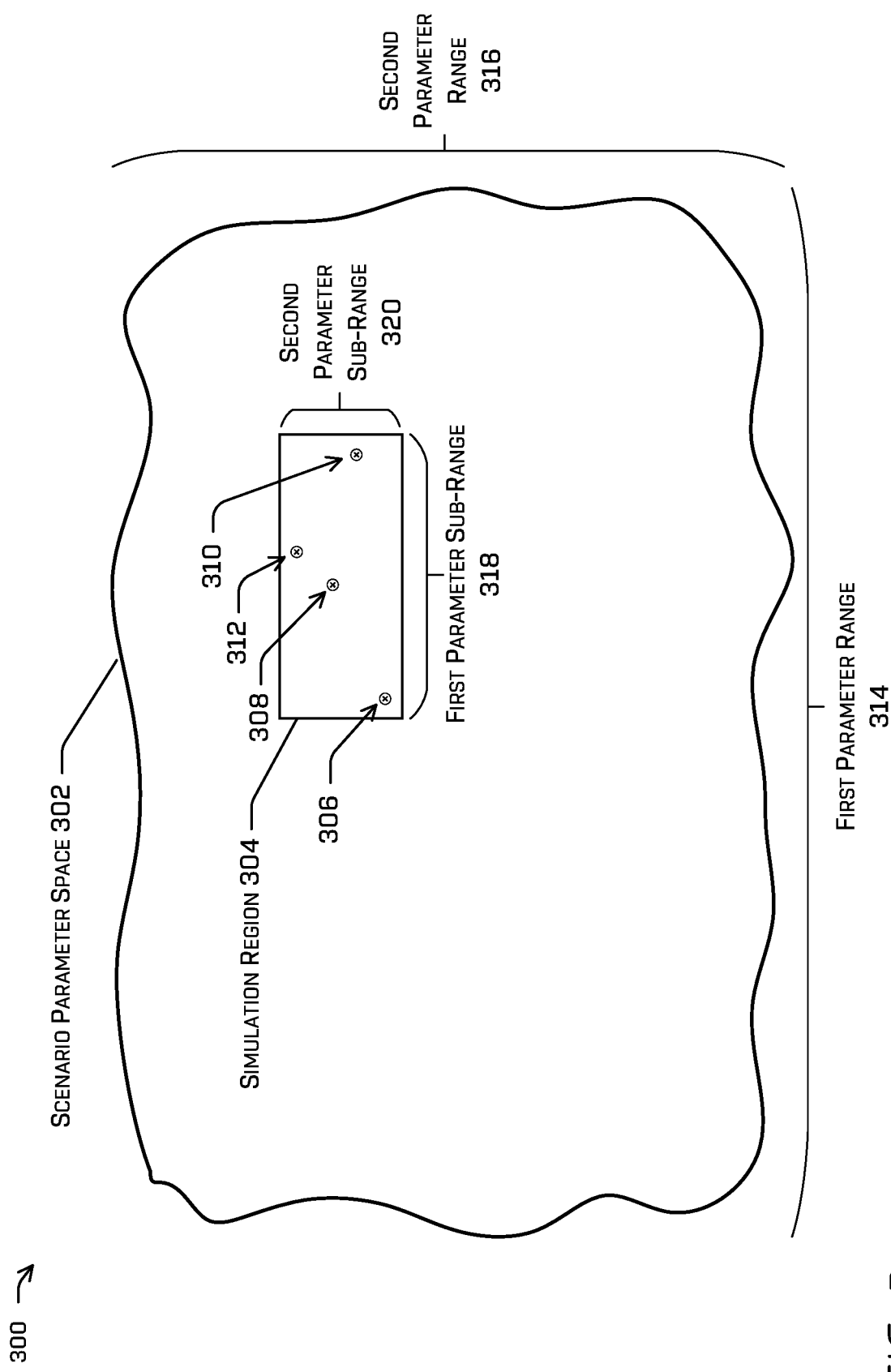
FIG. 3 illustrates an example scenario parameter space and simulation region associated with a driving scenario, in accordance with one or more implementations of the disclosure.

FIG. 3 is a diagram 300 showing an example parameter space 302 that may be associated with a driving scenario or other scenario. A simulation region 304 is identified within the parameter space 302, including points representing multiple different parameter sets 306-312. In this example, for each parameter set 306-312, a corresponding parameterized scenario was generated and executed, and a simulation result was determined indicating a failure of the parameterized scenario. Accordingly, the simulation region component 218 may determine the simulation region 304 as a particular subregion within the parameter space 302 that would encompass each of the parameter sets 306-312 of the failing scenarios. In this example, the parameter space 302 includes at least two dimensions, and is bounded by a first parameter range 314 associated with a first scenario parameter and a second parameter range 316 associated with a second scenario parameter. Based on the failing parameterized scenarios, the simulation region component 218 may determine a first parameter subrange 318 that encompasses the parameter values of the failing scenarios for the first parameter, and a second parameter subrange 320 that encompasses the parameter values of the failing scenarios for the second parameter.

In various implementations, the simulation region component 218 may determine the parameter subranges to define the simulation region 304 based on one or more failures of parameterized scenarios. For instance, in a group of multiple scenario failures, the simulation region component 218 may determine the smallest and largest parameter value for each parameter (or dimension), and determine the boundaries of parameter subrange based on the smallest and largest parameter values. As shown in this example, the simulation region component 218 also may use a buffer in some cases to increase the parameter subranges to include values below the smallest parameter value and/or above the largest parameter value, thereby increasing the overall size of the simulation region 304. In some examples, a buffer region of N % of the parameter subrange (e.g., 5%) may be added into each end of the parameter subrange.

Although the parameter space 302 and simulation region 304 are shown as two-dimensional areas in this example for illustrative purposes, it is to be understood that the parameter space 302 and simulation region 304 may include any number (e.g., tens or hundreds) of dimensions. As noted above, the parameter space 302 may include a dimension for each scenario parameter, and the simulation region 304 can include any number of dimensions up to and including the number of dimensions of the parameter space 302. Additionally, while the simulation region 304 is represented as a geometric shape defined based on uniform length sides (e.g., a 2D rectangular, a 3D box-shaped hyperrectangle, etc.), in other examples the multi-dimensional simulation region 304 need not have be boxed-shaped object with uniform-length sides. For instance, the simulation region 304 may be a freeform surface model or polytope designed to encompass the parameter sets of failing scenarios, while excluding areas having a larger distance from the failing parameter sets.

The parameter space 302 may represent the complete range of variations and/or permutations of parameterized scenarios that can be executed as simulations for the driving scenario. In some examples, failing parameterized scenarios may be infrequent and relatively sparse within the parameter space 302 as a whole. However, by defining the simulation region 304 to encompass the parameter sets 306-312 for a number of confirmed failing parameterized scenarios, the simulation region 304 may have a greater frequency or prevalence of failing parameterized scenarios than does the entire parameter space 302. In such examples, the likelihood of a parameterized scenario selected at random from within the simulation region 304 failing, may be greater than the likelihood of a random parameterized scenario selected outside of the simulation region 304. Further, the confidence level of the expected results of simulations based on parameterized scenarios selected from outside the simulation region 304 are to be greater than the confidence levels of the expected results of parameterized scenarios selected from inside the simulation region 304. For instance, if parameterized scenarios outside the simulation region 304 pass at a very high rate (e.g., 99.9%), and parameterized scenarios within the simulation region 304 also usually pass but at a less high rate (99%), then executing additional parameterized scenarios from within the simulation region 304 is likely to identify more failures and is also likely to have a higher degree of uncertainty associated with each parameterized scenario.

Additionally, although in this example the parameter space 302 includes only one simulation region 304, in other examples the simulation region component 218 may determine multiple separate simulation regions within the parameter space 302 of a driving scenario. For instance, when the parameter sets associated with the scenario failures are scattered widely across the parameter space 302, the simulation region component 218 may be configured to determine groupings of parameter sets (e.g., using a nearest neighbor algorithm or other multidimensional proximity search), and to define a separate simulation region for each grouping of failing parameterized scenarios.

Figure 4:
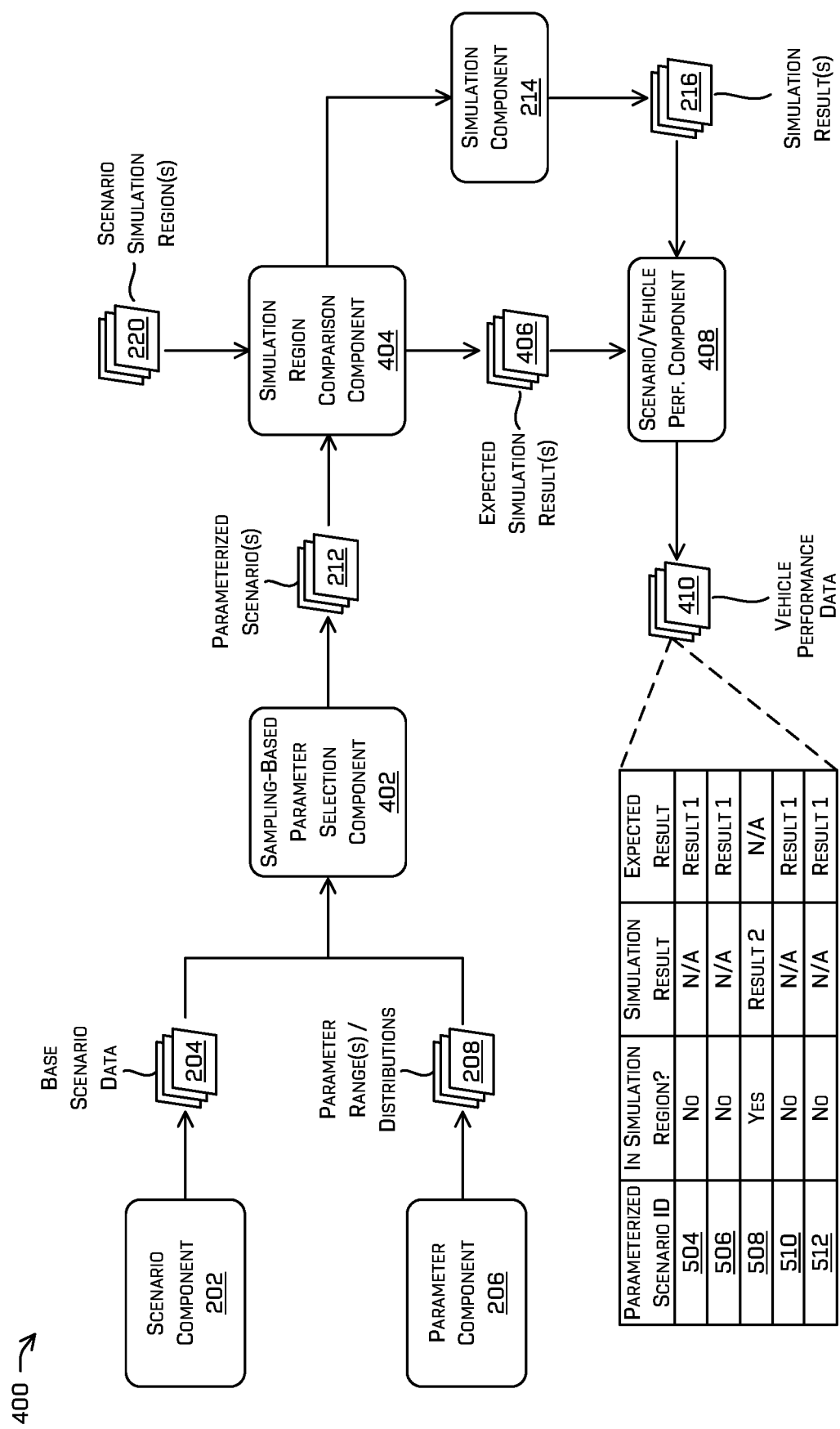
FIG. 4 illustrates components of an example system for evaluating vehicle and/or scenario performance based on parameterized scenarios determined using sampling-based techniques, in accordance with one or more implementations of the disclosure.

FIG. 4 shows an example system 400 including components configured to determine performance data (e.g., a vehicle safety metric and/or other scenario or vehicle performance metrics) associated with the driving scenario. As described below in more detail, the example system 400 may use sampling-based techniques to select parameter sets, and may compare the parameter sets to a simulation region to determine whether or not to perform a parameterized scenario simulation based on the parameter sets. In some cases, the example system 400 may be implemented as the same system and/or within the same computing devices as system 200 described above, and the same simulation region(s) 220 determined by the simulation region component 218 may be used by the components of system 400 to determine the performance data for the driving scenario. In other cases, systems 200 and 400 may be executed as separate systems operating on different computing devices, servers, and/or networks. In such examples, the system 200 may analyze driving scenarios as described above to determine simulation region(s) 220, which may be transmitted over a network to the system 400 for use in analyzing the performance of the driving scenarios.

Within example system 400, the scenario component 202 may select and/or generate base scenario data 204 associated with a driving scenario. As shown in this example, the scenario component 202 may be identical to the scenario component 202 used in system 200, although different implementations of the scenario component(s) may be used in other examples. As described above, the base scenario data 204 for a driving scenario may include data describing the simulated environment and objects within the driving scenario. In some examples, the base scenario data 204 also may include base parameter values (or attributes) for the objects within the scenario, such as the positions, sizes, velocities, accelerations, and poses of the scenario objects, and/or the relative positions, relative velocities, relative yaw, etc. between pairs of objects.

In system 400, the parameter component 206 may determine scenario parameters, including base parameter values and/or perturbed parameter values that have been updated from the base parameters using absolute or relative parameter offsets, for the driving scenarios in the base scenario data 204. As shown in this example, the parameter component 206 may be identical to the parameter component 206 used in system 200, and may determine parameter data 208 (e.g., parameter ranges and distributions) associated with each scenario parameter. For example, as described above the parameter data 208 may include a probability distribution for each scenario parameter, based on log data, error models, and/or other data reflecting realistic distributions of values for the parameters during real-world driving situations.

A sampling-based parameter selection component 402 may receive the base scenario data 204 and associated parameter data 208 (e.g., parameter distributions), and may determine parameter sets for the scenario using sampling techniques. As described above, the selection of a parameter set may include determining a parameter value associated with each scenario parameter. If a driving scenario includes five modifiable parameters (e.g., object positions, trajectories, velocities, and/or other attributes), then a parameter set selected for the driving scenario may include five parameter values, one for each of the scenario parameters.

In contrast to the non-sampling parameter selection component 210 used in system 200, the sampling-based parameter selection component 402 may determine parameter sets by sampling from the probability distributions of the scenario parameters. Because sampling is used, the scenario parameter values for an object's position, velocity, acceleration, size, pose, etc., are more likely to be selected from nearer the mean of the distribution. Accordingly, the parameter sets selected by the sampling-based parameter selection component 402 are more likely to represent higher probability and more frequent real-world driving scenarios. Of course, any combination of sampling and non-sampling-based techniques may be used.

After using a sampling-based technique to select a set of parameters for a driving scenario, the sampling-based parameter selection component 402 may use the set of parameters to modify the base scenario data 204, to generate a parameterized scenario 212. The sets of parameters determined by sampling-based parameter selection component 402, and the corresponding parameterized scenarios 212, may be similar or identical in form to those determined by the non-sampling parameter selection component 210 described above. However, as noted above, the parameterized scenarios 212 generated by the sampling-based parameter selection component 402 may represent, on average, more common and frequently encountered real-world driving scenarios.

The simulation region comparison component 404 may receive parameterized scenarios 212 from the sampling-based parameter selection component 402, and compare the parameterized scenarios 212 to the simulation region(s) 220 determined above by system 200. For example, the simulation region comparison component 404 may receive or determine a parameter set containing N parameter values, for a sampling-based parameterized scenario 212. The simulation region comparison component 404 may compare each of the N parameter values to the corresponding subrange for the simulation region 220. In this example, if every value in a parameter set is within the corresponding subrange for that parameter, then the parameter set as a whole (and the parameterized scenario 212) is within the simulation region 220. Otherwise, the parameter set is outside of the simulation region 220.

In this example, if a parameterized scenario 212 is determined to be within the simulation region 220, then the simulation component 214 executes a simulation based on the parameterized scenario 212 and determines simulation results 216. In this example, the simulation component 214 may be identical to the simulation component 214 used in system 200, although different simulation components may be used in other examples. As described above, the simulation component 214 may provide a simulated environment and objects, and instantiate a vehicle controller to control a simulated vehicle within the environment. The simulation component 214 can determine the simulation results 216 (and/or other simulation outcomes) for the parameterized scenario 212, indicating how the autonomous vehicle controller performed with respect to one or more predetermined behaviors or outcomes, and/or determine if any predetermined rules/assertions were broken/triggered. The simulation results 216 for the executed parameterized scenarios may be provided to the scenario/vehicle performance component 408.

However, if a parameterized scenario 212 is determined to be outside of the simulation region 220, then in this example a simulation is not executed based on the parameterized scenario 212. In contrast, as shown in system 400, the simulation region comparison component 404 may provide expected simulation results 406 to the scenario/vehicle performance component 408 without a simulation being executed for the parameterized scenario 212. The expected simulation results 406 may correspond to a likely or probable result/outcome of a simulation, if a simulation were to be executed for the parameterized scenario 212. For driving scenarios that have very high overall passing rates, the expected simulation results 406 may correspond to a passing result. Further, parameterized scenarios 212 outside of the simulation region 220 may have even higher overall passing rates than the passing rates for the driving scenario as a whole (e.g., within the entire parameter space), and therefore the expected simulation result 406 of a passing result may be likely to match the actual result if a simulation were executed.

Although the above example may apply for driving scenarios having high overall passing rates, similar but inverted techniques may be used for driving scenarios having low overall passing rates. For instance, in such cases the simulation region 220 may encompass passing parameterized scenarios rather than failing scenarios, and the expected simulation results 406 may correspond to failing rather than passing results.

The scenario/vehicle performance component 408 may aggregate the simulation results 216 for the parameter scenarios 212 executed as simulations, with the expected simulation results 406 for the parameter scenarios 212 not executed as simulations. In various examples, the scenario/vehicle performance component 408 may output various different types vehicle performance data 410 including statistics and metrics associated with the performance of the vehicle controller within the driving scenario. For instance, the vehicle performance data 410 may include one or more vehicle safety metrics such as collision rates, near-miss collision rates, speed limit or traffic violation rates, rates of excess braking or acceleration, comfort metric compliance rates and/or any data associated with the performance of the vehicle controller within the driving scenario.

Figure 5:
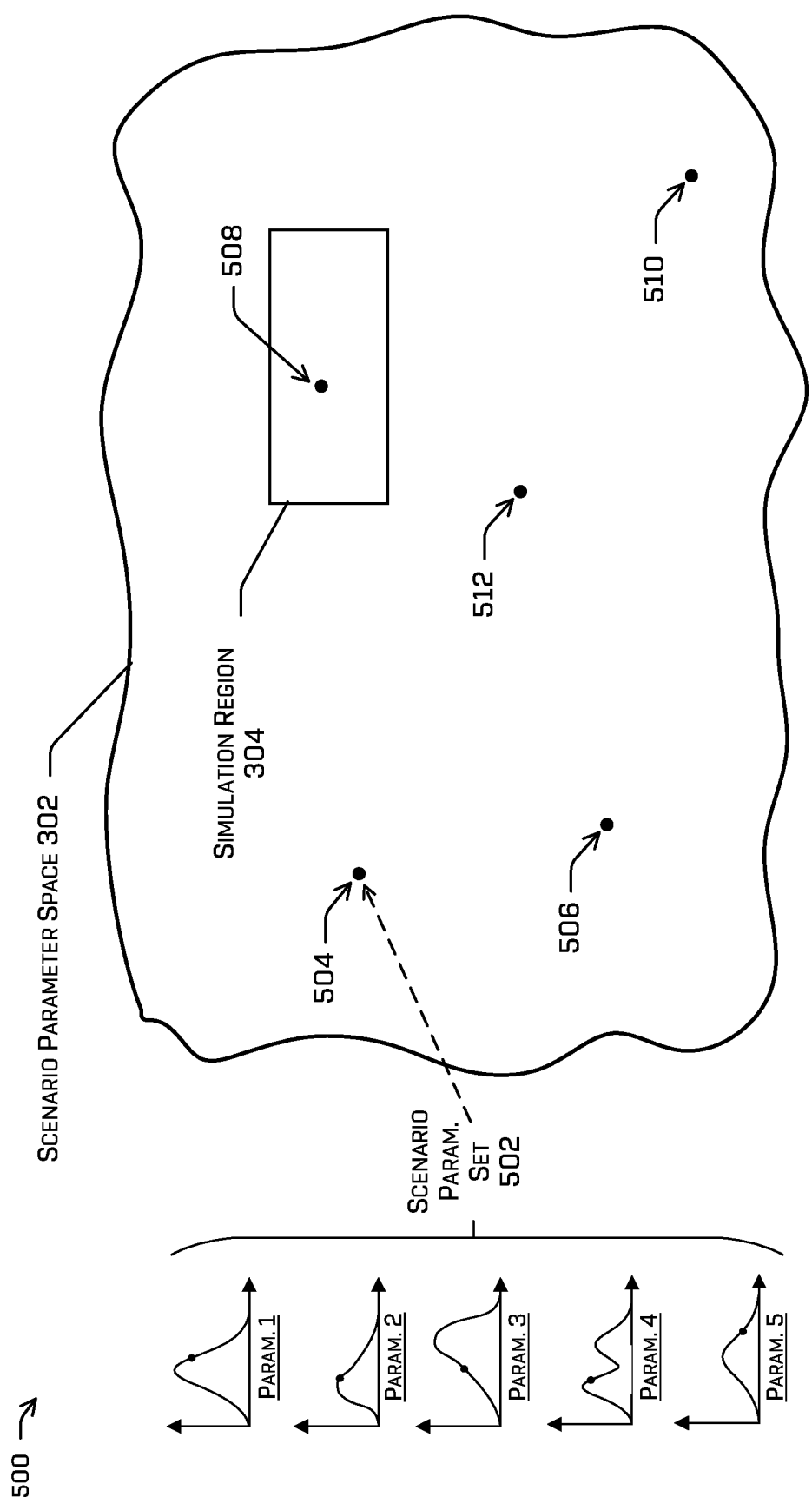
FIG. 5 illustrates an example scenario parameter space, simulation region, and sampling-based parameter sets associated with a driving scenario, in accordance with one or more implementations of the disclosure.

FIG. 5 is another diagram 500 illustrating the example parameter space 302 and simulation region 304 described above in reference to FIG. 3. Several additional points are shown in this example representing parameter sets determined using sampling-based techniques. For instance, an joint parameter distribution 502 is shown, representing a set of parameter values sampled from a single multi-dimensional joint distribution for the scenario parameters, by the sampling-based parameter selection component 402. The parameter values sampled from the joint parameter distribution 502, as a group, correspond to a parameter set 504 within the parameter space 302. Additionally, several other parameter sets 506-512 determined using sampling-based techniques are shown within the parameter space 302. As shown in this example, the sampling-based parameter sets 504, 506, 510, and 512 are all outside of the simulation region 304, and thus the corresponding parameterized scenarios for these parameter sets are not to be executed. However, one sampling-based parameter set 508 is within the simulation region 304, and thus a parameterized scenario based on parameter set 508 may be executed as a simulation.

Referring again to system 400, the vehicle performance data 410 shows results associated with each of the sampling-based parameter sets depicted in FIG. 5. In this example, parameterized scenarios are not executed based on any of the parameter sets 504, 506, 510, or 512 outside of the simulation region, and instead the vehicle performance data 410 includes the expected result ("Result 1") associated with each of these parameterized scenarios. However, the parameterized scenario based on parameter set 508 within the simulation region 220 may be executed as a simulation, and the vehicle performance data 410 may include the actual result ("Result 2") of the executed simulation. In this example, the vehicle performance data 410 scenario/vehicle performance component 408 may aggregate the results for the simulation for all sampling-based parameterized scenarios, including the simulation results of executed simulations and the expected results of non-executed simulations, to determine the vehicle safety metrics and/or other performance metrics based on the vehicle performance data 410.

Figure 6:
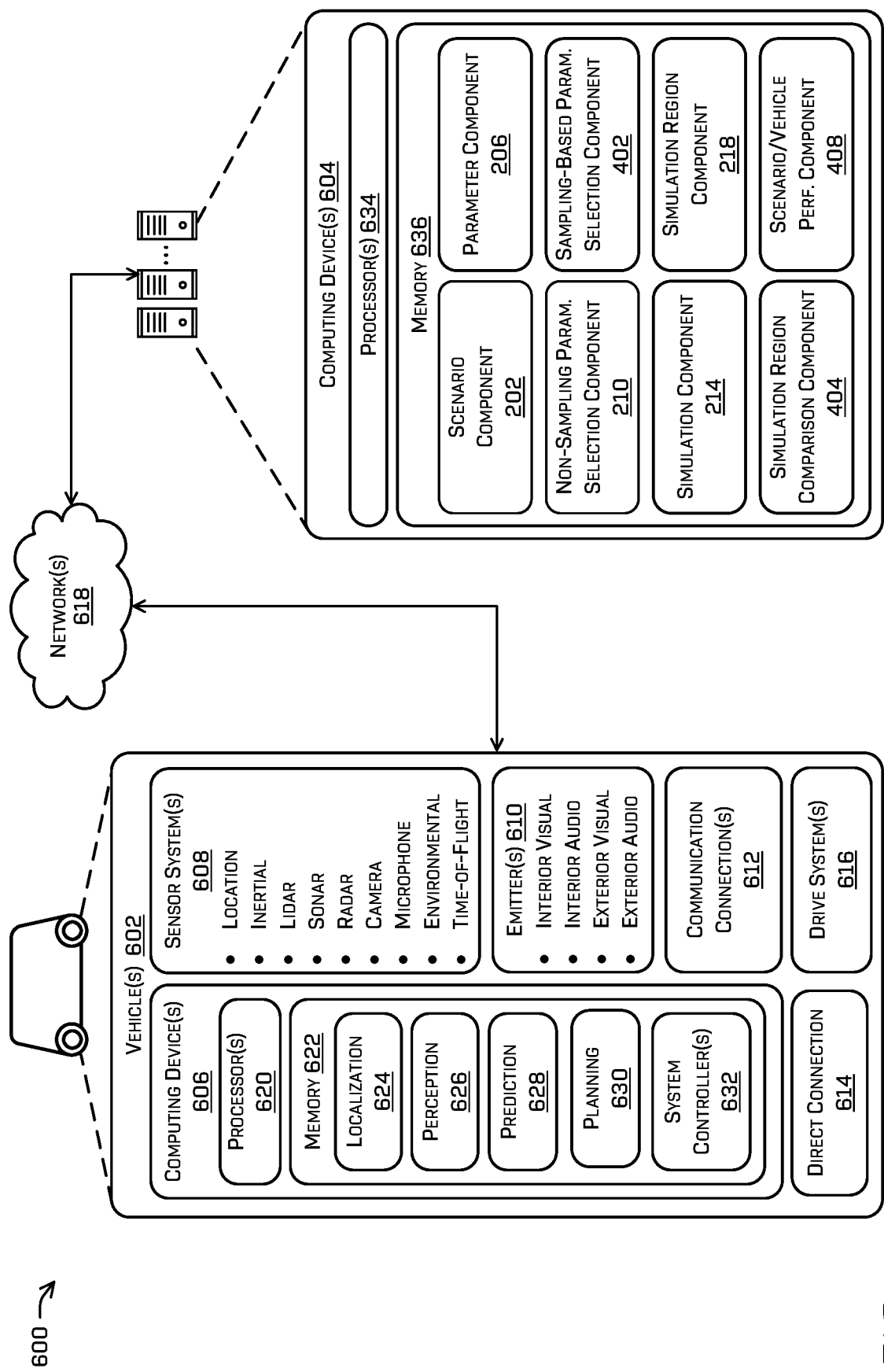
FIG. 6 depicts a block diagram of an example system for implementing various techniques described herein.

FIG. 6 depicts a block diagram of an example system 600 for implementing the techniques discussed herein. In at least one example, the system 600 can include one or more vehicles 602, and one or more computing devices 604. In some examples, the computing devices 604 may correspond to an autonomous vehicle simulation system configured to communicate with vehicle(s) 602 to generate, execute, and evaluate driving simulations. The vehicle(s) 602 may include various software-based and/or hardware-based components of autonomous vehicles, and may be used to control autonomous vehicles traversing through physical environments and/or simulated vehicles operating within driving simulations. In some cases, the vehicle(s) 602 may correspond to a vehicle traversing a physical environment, capturing and storing log data which may be provided to a simulation system. Additionally or alternatively, the vehicle(s) 602 may correspond to a simulated vehicle operating within a driving simulation, as one or more separate vehicle control systems, interacting with and being evaluated by a simulation system during a driving simulation.

In at least one example, the vehicle 602 may correspond to an autonomous or semi-autonomous vehicle configured to perform object perception and prediction functionality, route planning and/or optimization. The example vehicle 602 can be a driverless vehicle, such as an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. In such examples, because the vehicle 602 can be configured to control all functions from start to completion of the trip, including all parking functions, it may not include a driver and/or controls for driving the vehicle 602, such as a steering wheel, an acceleration pedal, and/or a brake pedal. This is merely an example, and the systems and methods described herein may be incorporated into any ground-borne, airborne, or waterborne vehicle, including those ranging from vehicles that need to be manually controlled by a driver at all times, to those that are partially or fully autonomously controlled.

The vehicle(s) 602 can include a computing device(s) 606, one or more sensor system(s) 608, one or more emitter(s) 610, one or more communication connection(s)

612 (also referred to as communication devices and/or modems), at least one direct connection 614 (e.g., for physically coupling with the vehicle(s) 602 to exchange data and/or to provide power), and one or more drive system(s) 616. The one or more sensor system(s) 608 can be configured to capture sensor data associated with an environment.

The sensor system(s) 608 can include time-of-flight sensors, location sensors (e.g., GPS, compass, etc.), inertial sensors (e.g., inertial measurement units (IMUs), accelerometers, magnetometers, gyroscopes, etc.), lidar sensors, radar sensors, sonar sensors, infrared sensors, cameras (e.g., RGB, IR, intensity, depth, etc.), microphone sensors, environmental sensors (e.g., temperature sensors, humidity sensors, light sensors, pressure sensors, etc.), ultrasonic transducers, wheel encoders, etc. The sensor system(s) 608 can include multiple instances of each of these or other types of sensors. For instance, the time-of-flight sensors can include individual time-of-flight sensors located at the corners, front, back, sides, and/or top of the vehicle(s) 602. As another example, the camera sensors can include multiple cameras disposed at various locations about the exterior and/or interior of the vehicle(s) 602. The sensor system(s) 608 can provide input to the computing device(s) 606.

The vehicle(s) 602 can also include one or more emitter(s) 610 for emitting light and/or sound. The one or more emitter(s) 610 in this example include interior audio and visual emitters to communicate with passengers of the vehicle(s) 602. By way of example and not limitation, interior emitters can include speakers, lights, signs, display screens, touch screens, haptic emitters (e.g., vibration and/or force feedback), mechanical actuators (e.g., seatbelt tensioners, seat positioners, headrest positioners, etc.), and the like. The one or more emitter(s) 610 in this example also include exterior emitters. By way of example and not limitation, the exterior emitters in this example include lights to signal a direction of travel or other indicator of vehicle action (e.g., indicator lights, signs, light arrays, etc.), and one or more audio emitters (e.g., speakers, speaker arrays, horns, etc.) to audibly communicate with pedestrians or other nearby vehicles, one or more of which may comprise acoustic beam steering technology.

The vehicle(s) 602 can also include one or more communication connection(s) 612 that enable communication between the vehicle(s) 602 and one or more other local or remote computing device(s) (e.g., a remote teleoperations computing device) or remote services. For instance, the communication connection(s) 612 can facilitate communication with other local computing device(s) on the vehicle(s) 602 and/or the drive system(s) 616. Also, the communication connection(s) 612 can allow the vehicle(s) 602 to communicate with other nearby computing device(s) (e.g., other nearby vehicles, traffic signals, etc.).

The communications connection(s) 612 can include physical and/or logical interfaces for connecting the computing device(s) 606 to another computing device or one or more external network(s) 618 (e.g., the Internet). For example, the communications connection(s) 612 can enable Wi-Fi-based communication such as via frequencies defined by the IEEE 802.11 standards, short range wireless frequencies such as Bluetooth, cellular communication (e.g., 2G, 3G, 4G, 4G LTE, 5G, etc.), satellite communication, dedicated short-range communications (DSRC), or any suitable wired or wireless communications protocol that enables the respective computing device to interface with the other computing device(s). In at least some examples, the communication connection(s) 612 may comprise the one or more modems as described in detail above.

In at least one example, the vehicle(s) 602 can include one or more drive system(s) 616. In some examples, the vehicle(s) 602 can have a single drive system 616. In at least one example, if the vehicle(s) 602 has multiple drive systems 616, individual drive systems 616 can be positioned on opposite ends of the vehicle(s) 602 (e.g., the front and the rear, etc.). In at least one example, the drive system(s) 616 can include one or more sensor system(s) 608 to detect conditions of the drive system(s) 616 and/or the surroundings of the vehicle(s) 602. By way of example and not limitation, the sensor system(s) 608 can include one or more wheel encoders (e.g., rotary encoders) to sense rotation of the wheels of the drive systems, inertial sensors (e.g., inertial measurement units, accelerometers, gyroscopes, magnetometers, etc.) to measure orientation and acceleration of the drive system, cameras or other image sensors, ultrasonic sensors to acoustically detect objects in the surroundings of the drive system, lidar sensors, radar sensors, etc. Some sensors, such as the wheel encoders can be unique to the drive system(s) 616. In some cases, the sensor system(s) 608 on the drive system(s) 616 can overlap or supplement corresponding systems of the vehicle(s) 602 (e.g., sensor system(s) 608).

The drive system(s) 616 can include many of the vehicle systems, including a high voltage battery, a motor to propel the vehicle, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive system(s) 616 can include a drive system controller which can receive and preprocess data from the sensor system(s) 608 and to control operation of the various vehicle systems. In some examples, the drive system controller can include one or more processor(s) and memory communicatively coupled with the one or more processor(s). The memory can store one or more modules to perform various functionalities of the drive system(s) 616. Furthermore, the drive system(s) 616 also include one or more communication connection(s) that enable communication by the respective drive system with one or more other local or remote computing device(s).

The computing device(s) 606 can include one or more processor(s) 620 and memory 622 communicatively coupled with the one or more processor(s) 620. In the illustrated example, the memory 622 of the computing device(s) 606 stores a localization component 624, a perception component 626, a prediction component 628, a planning component 630, and one or more system controller(s) 632. Though depicted as residing in the memory 622 for illustrative purposes, it is contemplated that the localization component 624, the perception component 626, the prediction component 628, the planning component 630, and the one or more system controller(s) 632 can additionally, or alternatively, be accessible to the computing device(s) 606 (e.g., stored in a different component of vehicle(s) 602 and/or be accessible to the vehicle(s) 602 (e.g., stored remotely).

In memory 622 of the computing device(s) 606, the localization component 624 can include functionality to receive data from the sensor system(s) 608 to determine a position of the vehicle(s) 602. For example, the localization component 624 can include and/or request/receive a three-dimensional map of an environment and can continuously determine a location of the autonomous vehicle within the map. In some instances, the localization component 624 can use SLAM (simultaneous localization and mapping) or CLAMS (calibration, localization and mapping, simultaneously) to receive time-of-flight data, image data, lidar data, radar data, sonar data, IMU data, GPS data, wheel encoder data, or any combination thereof, and the like to accurately determine a location of the autonomous vehicle. In some instances, the localization component 624 can provide data to various components of the vehicle(s) 602 to determine an initial position of an autonomous vehicle for generating a trajectory, as discussed herein.

The perception component 626 can include functionality to perform object detection, segmentation, and/or classification. In some examples, the perception component 626 can provide processed sensor data that indicates a presence of an entity that is proximate to the vehicle(s) 602 and/or a classification of the entity as an entity type (e.g., car, pedestrian, cyclist, building, tree, road surface, curb, sidewalk, unknown, etc.). In additional and/or alternative examples, the perception component 626 can provide processed sensor data that indicates one or more characteristics (also referred to as parameters) associated with a detected entity and/or the environment in which the entity is positioned. In some examples, characteristics associated with an entity can include, but are not limited to, an x-position (global position), a y-position (global position), a z-position (global position), an orientation, an entity type (e.g., a classification), a velocity of the entity, an extent of the entity (size), etc. Characteristics associated with the environment can include, but are not limited to, a presence of another entity in the environment, a state of another entity in the environment, a time of day, a day of a week, a season, a weather condition, a geographic position, an indication of darkness/light, etc.

The perception component 626 can include functionality to store perception data generated by the perception component 626. In some instances, the perception component 626 can determine a track corresponding to an object that has been classified as an object type. For purposes of illustration only, the perception component 626, using sensor system(s) 608 can capture one or more images of an environment. The sensor system(s) 608 can capture images of an environment that includes an object, such as a pedestrian. The pedestrian can be at a first position at a time T and at a second position at time T+t (e.g., movement during a span of time t after time T). In other words, the pedestrian can move during this time span from the first position to the second position. Such movement can, for example, be logged as stored perception data associated with the object.

The stored perception data can, in some examples, include fused perception data captured by the vehicle. Fused perception data can include a fusion or other combination of sensor data from sensor system(s) 608, such as image sensors, lidar sensors, radar sensors, time-of-flight sensors, sonar sensors, global positioning system sensors, internal sensors, and/or any combination of these. The stored perception data can additionally or alternatively include classification data including semantic classifications of objects (e.g., pedestrians, vehicles, buildings, road surfaces, etc.) represented in the sensor data. The stored perception data can additionally or alternatively include a track data (collections of historical positions, orientations, sensor features, etc. associated with the object over time) corresponding to motion of objects classified as dynamic objects through the environment. The track data can include multiple tracks of multiple different objects over time. This track data can be mined to identify images of certain types of objects (e.g., pedestrians, animals, etc.) at times when the object is stationary (e.g., standing still) or moving (e.g., walking, running, etc.). In this example, the computing device determines a track corresponding to a pedestrian.

The prediction component 628 can generate one or more probability maps representing prediction probabilities of possible locations of one or more objects in an environment. For example, the prediction component 628 can generate one or more probability maps for vehicles, pedestrians, animals, and the like within a threshold distance from the vehicle(s) 602. In some instances, the prediction component 628 can measure a track of an object and generate a discretized prediction probability map, a heat map, a probability distribution, a discretized probability distribution, and/or a trajectory for the object based on observed and predicted behavior. In some instances, the one or more probability maps can represent an intent of the one or more objects in the environment.

The planning component 630 can determine a path for the vehicle(s) 602 to follow to traverse through an environment. For example, the planning component 630 can determine various routes and paths and various levels of detail. In some instances, the planning component 630 can determine a route to travel from a first location (e.g., a current location) to a second location (e.g., a target location). For the purpose of this discussion, a route can be a sequence of waypoints for traveling between two locations. As non-limiting examples, waypoints include streets, intersections, global positioning system (GPS) coordinates, etc. Further, the planning component 630 can generate an instruction for guiding the autonomous vehicle along at least a portion of the route from the first location to the second location. In at least one example, the planning component 630 can determine how to guide the autonomous vehicle from a first waypoint in the sequence of waypoints to a second waypoint in the sequence of waypoints. In some examples, the instruction can be a path, or a portion of a path. In some examples, multiple paths can be substantially simultaneously generated (i.e., within technical tolerances) in accordance with a receding horizon technique. A single path of the multiple paths in a receding data horizon having the highest confidence level may be selected to operate the vehicle.

In other examples, the planning component 630 can alternatively, or additionally, use data from the perception component 626 to determine a path for the vehicle(s) 602 to follow to traverse through an environment. For example, the planning component 630 can receive data from the perception component 626 regarding objects associated with an environment. Using this data, the planning component 630 can determine a route to travel from a first location (e.g., a current location) to a second location (e.g., a target location) to avoid objects in an environment. In at least some examples, such a planning component 630 may determine there is no such collision free path and, in turn, provide a path which brings vehicle(s) 602 to a safe stop avoiding all collisions and/or otherwise mitigating damage.

In at least one example, the computing device(s) 606 can include one or more system controller(s) 632, which can be configured to control steering, propulsion, braking, safety, emitters, communication, and other systems of the vehicle(s)

602. These system controller(s) 632 can communicate with and/or control corresponding systems of the drive system(s) 616 and/or other components of the vehicle(s) 602, which may be configured to operate in accordance with a path provided from the planning component 630.

The vehicle(s) 602 can connect to one or more external computing device(s) 604 via network(s) 618. Computing device(s) 604 can include one or more processor(s) 634 and memory 636 communicatively coupled with the one or more processor(s) 634. In at least one instance, the one or more processor(s) 634 can be similar or identical to the processor(s) 620 and the memory 636 can be similar or identical to the memory 622. In the illustrated example, the memory 636 of the computing device(s) 604 stores a scenario component 202, a parameter component 206, a non-sampling parameter selection component 210, a sampling-based parameter selection component 402, a simulation component 214, a simulation region component 218, a simulation region comparison component 404, and a scenario/vehicle performance component 408. Each of the components depicted in the memory 636 of the computing device(s) 604 in this example may be configured to perform the functionality of the corresponding components described above in reference to FIG. 2 and FIG. 4. In various example, one or more of the components within the memory 636 of the computing device(s) 604 may be combined, and/or the functionality of any components may be executed within other component(s) in other implementations. Additionally although depicted as residing in the memory 636 for illustrative purposes, it is contemplated that any or all of the scenario component 202, parameter component 206, non-sampling parameter selection component 210, sampling-based parameter selection component 402, simulation component 214, simulation region component 218, simulation region comparison component 404, and scenario/vehicle performance component 408 can, additionally or alternatively, be remotely accessible to the vehicle(s) 602 and/or the computing device(s) 604. For instance, any or all of the components within the computing device(s) 604 can be stored in a different component of computing device(s) 604, stored on the vehicle(s) 602, and/or stored remotely and accessible to the vehicle(s) 602 and computing device(s) 604 via one or more networks 618.

The processor(s) 620 of the computing device(s) 606 and the processor(s) 634 of the computing device(s) 604 can be any suitable processor capable of executing instructions to process data and perform operations as described herein. By way of example and not limitation, the processor(s) 620 and 634 can comprise one or more Central Processing Units (CPUs), Graphics Processing Units (GPUs), or any other device or portion of a device that processes electronic data to transform that electronic data into other electronic data that can be stored in registers and/or memory. In some examples, integrated circuits (e.g., ASICs, etc.), gate arrays (e.g., FPGAs, etc.), and other hardware devices can also be considered processors in so far as they are configured to implement encoded instructions.

The memory 622 computing device(s) 606 and the memory 636 of the computing device(s) 604 are examples of non-transitory computer-readable media. The memory 622 and 636 can store an operating system and one or more software applications, instructions, programs, and/or data to implement the methods described herein and the functions attributed to the various systems. In various implementations, the memory 622 and 636 can be implemented using any suitable memory technology, such as static random access memory (SRAM), synchronous dynamic RAM (SDRAM), nonvolatile/Flash-type memory, or any other type of memory capable of storing information. The architectures, systems, and individual elements described herein can include many other logical, programmatic, and physical components, of which those shown in the accompanying figures are merely examples that are related to the discussion herein.

In some instances, aspects of some or all of the components discussed herein can include any models, algorithms, and/or machine learning algorithms. For example, in some instances, the components in the memory 622 and 636 can be implemented as a neural network.

Figure 7:
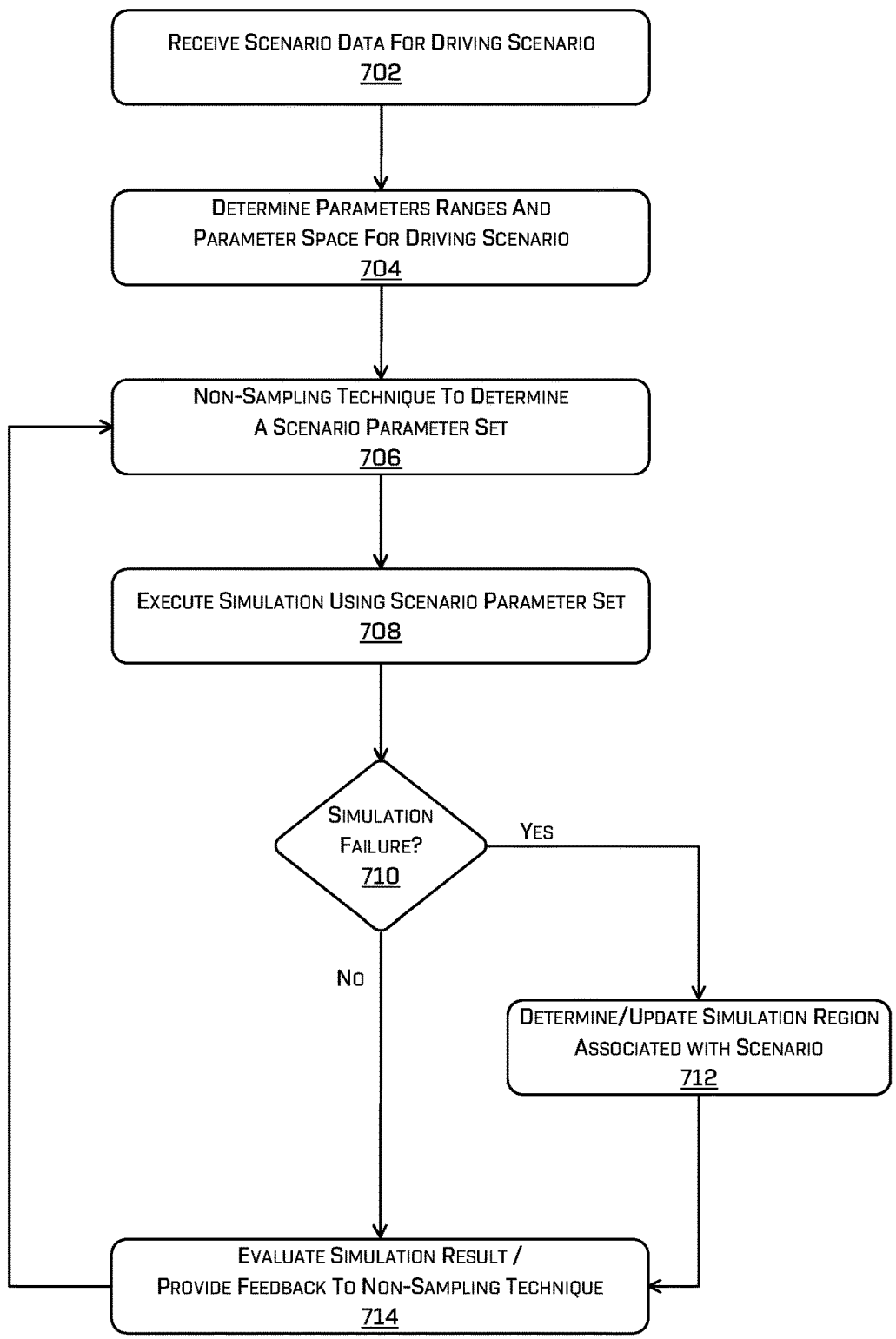
FIG. 7 is a flow diagram illustrating an example process of determining a simulation region within a parameter space associated with a scenario, in accordance with one or more implementations of the disclosure.

FIG. 7 depicts an example process 700 for determining a simulation region within a parameter space, using non-sampling-based parameter selection techniques. Some or all of the operations in process 700 can be performed by one or more components in FIGS. 1-6, as described herein. For example, some or all of the process 700 can be performed by the components described in systems 200 and 400, operating within vehicle(s) 602 and/or computing device(s) 604.

At operation 702, the computing device(s) 604 may receive scenario data associated with a driving scenario. In some examples, a scenario component 202 may generate and/or provide base scenario data associated with a driving scenario. Driving scenarios may include, for instance, intersection scenarios, crosswalk scenarios, freeway merging scenarios, bumper-to-bumper traffic scenarios, parallel parking scenarios, and so on. The scenario data received in operation 702 may include various data describing the simulated environment, and/or any static or dynamic objects to be rendered in the simulated environment for the driving scenario. In some cases, the scenario data may include the base (or default) parameter values associated with the objects in the scenario.

At operation 704, the computing device(s) 604 may receive or determine parameter data associated with the driving scenario, including parameter values, ranges, and/or distributions. For example, the parameter component 206 may receive or determine parameter data for any modifiable parameters (e.g., object attributes) of the driving scenario. Non-limiting examples such parameters may include the position, size, velocity, acceleration, trajectory, yaw, and/or pose of any object in the scenario. Additional parameters in a parameterized scenario may correspond to relative data between different objects in the scenario, such as relative distances, relative velocities, and/or relative yaws between any pair of objects. For each modifiable parameter of the driving scenario, the parameter data may include a parameter range that defines the upper and lower limits of possible values for that parameter. The parameter space may be represented as a continuous multidimensional region, with a dimension associated with each parameter and the size/magnitude of the dimension corresponding to the parameter range.

At operation 706, the computing device(s) 604 may use a non-sampling technique to determine a parameter set associated with the driving scenario. In various implementations, a Bayesian optimization technique and/or other machine-learning optimization algorithms may be used to determine a parameter value for each scenario parameter. As discussed above, the non-sampling technique used in operation 706 may select parameter sets without regard to the probability distributions of the scenario parameters.

At operation 708, the computing device(s) 604 may execute a driving simulation, based on the scenario data received in operation 702, and the scenario parameter set determined based on non-sampling techniques in operation 706. In some examples, a simulation component 214 may instantiate and simulate the responses of a vehicle controller to the simulated environment, including simulated vehicles and/or other objects, within the parameterized scenario including the parameter values perturbed based on selected parameter set.

At operation 710, the computing device(s) 604 may analyze the simulation results and/or outcomes to determine whether the simulation based on the parameterized scenario has failed. In various examples, the determination of a scenario failure may be based on determining that the autonomous vehicle controller performed inconsistently with the predetermined outcome(s) of the driving scenario, and determining that a rule was broken or than an assertion was triggered, during the execution of the simulation based on the parameterized scenario.

When the driving simulation based on the parameterized scenario fails (710:Yes), then at operation 712 the computing device(s) 604 may determine a new simulation region and/or update an existing simulation region based on the scenario failure. As discussed above, a simulation region may correspond to a subregion within the parameter space for the driving scenario. Determining the simulation region may include determining subranges of the parameter ranges for some or all of the scenario parameters. Each parameter subrange may be based on the parameter values used in the failing parameterized scenarios. For instance, the simulation region component may receive data for multiple parameterized scenario failures, determine the smallest and largest parameter value for each parameter, and then determine the boundaries each parameter subrange to encompass the smallest and largest parameter values for each scenario parameter. Accordingly, the simulation region determined (and/or updated) at operation 712 may encompass at least the parameter sets of any or all scenario failures identified in operation 710.

After determining or updating the simulation region in operation 712 based on the scenario failure, or when the driving simulation based on the parameterized scenario passes (710:No) and the simulation region is not determined or updated based on a scenario failure, then process 700 may proceed to operation 714. At operation 714, the computing device(s) 604 may further analyze and evaluate the simulation results to provide feedback for the non-sampling parameter selection technique used on operation 706. For example, in some cases a Bayesian optimization technique or other machine-learning based optimization algorithm may use the results and/or outcomes of previous simulation to determine the parameter sets for subsequent iterations of the non-sampling technique. For instance, as described above, the selection of the parameter sets by a Bayesian optimization algorithm (or other machine-learning non-sampling technique) may be configured to explore and exploit the parameter space, both by selecting parameter sets with a high level of result uncertainty in the parameter space (e.g., exploring), and selecting parameter sets with high likelihood of identifying a new parameterized scenario failure based on the previous simulation results (e.g., exploiting). For instance, a Bayesian optimization algorithm may select a parameter set near another parameter sets that resulted in a low minimum distance between the simulated vehicle and an object.

Figure 8:
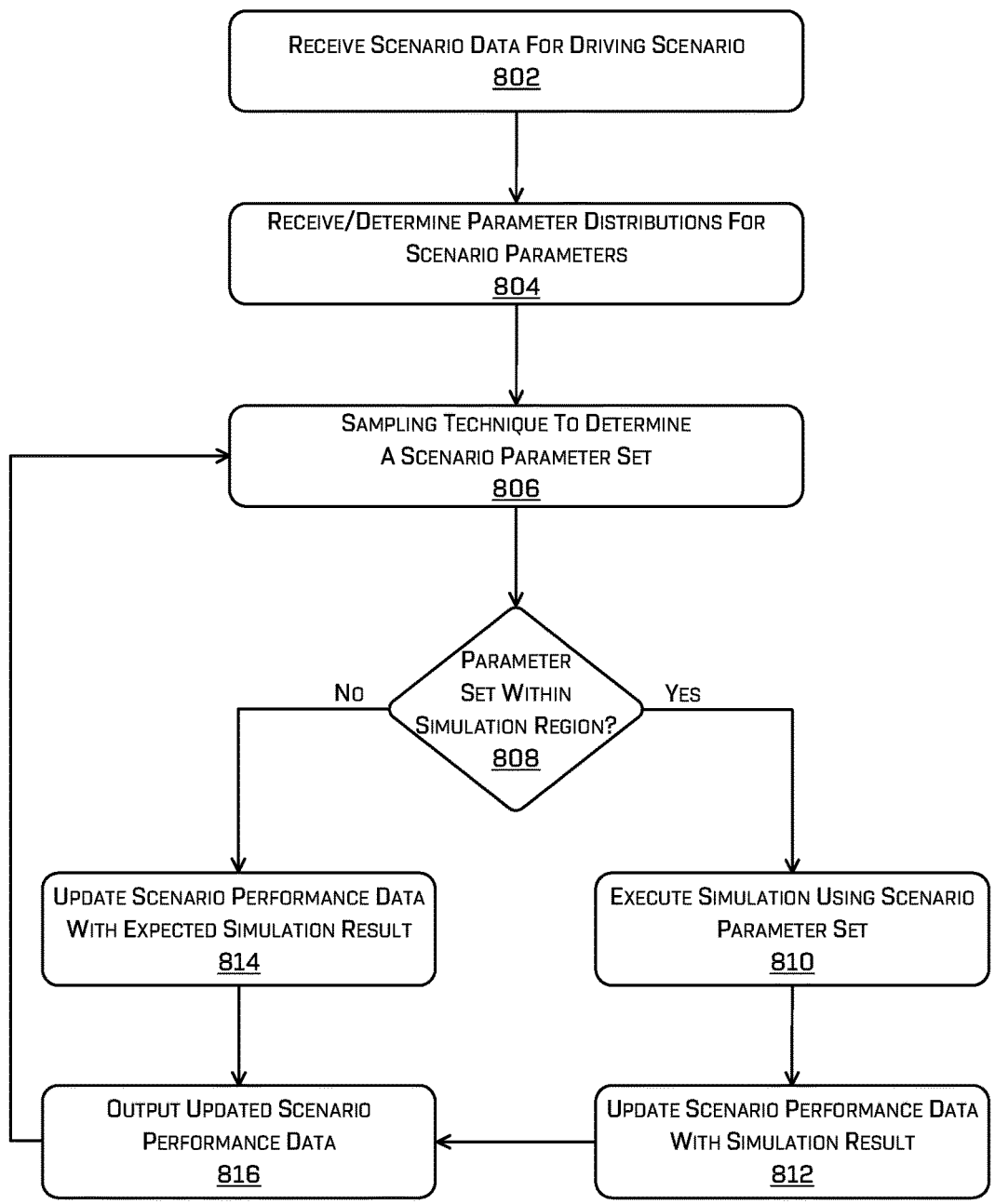
FIG. 8 is a flow diagram illustrating an example process of using sampling-based parameter selection to determine and execute simulations within a simulation region, in accordance with one or more implementations of the disclosure.

FIG. 8 depicts another example process 800 for using sampling-based parameter selection to determine and execute simulations within a simulation region, and determining scenario/vehicle performance data based on the simulation results. Some or all of the operations in process 800 can be performed by one or more components in FIGS. 1-6, as described herein. For example, some or all of the process 800 can be performed by the components described in systems 200 and 400, operating within vehicle(s) 602 and/or computing device(s) 604.

At operation 802, the computing device(s) 604 may receive scenario data associated with a driving scenario. Operation 802 may be similar or identical to operation 702 in some cases, in which a scenario component 202 may generate and/or provide base scenario data associated with a driving scenario. The scenario data received in operation 802 thus may include data describing a simulated environment, static or dynamic objects to be rendered in the simulated environment, and/or base (or default) parameter values associated with the objects in the scenario.

At operation 804, the computing device(s) 604 may receive and/or determine parameter data, including probability distributions associated with the parameters, for the scenario parameters of the driving scenario. For example, a parameter component 206 may receive or determine parameter distributions (e.g., a multi-dimensional joint distribution or multiple individual distributions) associated with each of the (modifiable) scenario parameters. Such scenario parameters may include (but are limited to) the position, size, velocity, acceleration, trajectory, yaw, or pose of any object in the scenario, and/or the relative distance, relative velocity, and/or relative yaws between any pair of objects in the scenario, etc.

At operation 806, the computing device(s) 604 may use a sampling-based technique to determine a parameter set associated with the driving scenario. Sampling techniques may include random and/or systematic sampling from the probability distributions associated with each of the scenario parameters. As described above, the parameter distributions received in operation 804 may include probability distributions for scenario parameters, based on log data, error models, and/or other data reflecting realistic distributions of values for the parameters during real-world driving situations. Accordingly, the sampling-based technique may use determine parameter values for the scenario parameters (e.g., object positions, velocities, accelerations, sizes, poses, distances between objects, etc.) in operation 806 that are more likely to represent higher probability and more frequent real-world driving scenarios.

At operation 808, the computing device(s) 604 may analyze the parameter set determined using the sampling-based technique in operation 806, to determine whether or not the parameter set is with the simulation region associated with the driving scenario. In some examples, the simulation region may correspond to the same simulation determined/updated in operation 712 for the driving scenario. To compare the parameter set to the simulation region, a simulation region comparison component 404 may compare each parameter value in the parameter set to corresponding parameter subrange in the simulation region. In this example, if every value in the parameter set falls within the corresponding subrange for that parameter, then the parameter set as a whole (and the parameterized scenario) is considered to be within the simulation region (808:Yes). Otherwise, the parameter set (and the parameterized scenario) are considered to be outside of the simulation region (808:No).

At operation 810, when the sample-based parameter set falls within the simulation region, the computing device(s) 604 may generate and execute a simulation for the parameterized scenario. Operation 810 may be similar or identical to operation 708 in some examples, in which a simulation component 214 may instantiate and simulate the responses of a vehicle controller to the simulated environment, including simulated vehicles and/or other objects, within the parameterized scenario including the parameter values perturbed based on selected parameter set.

At operation 812, the computing device(s) 604 may analyze and evaluate the simulation execution to determine results and/or outcomes associated with the driving scenario. The computing device(s) 604 also update scenario and/or vehicle performance data associated with the driving scenario, based on the simulation results and/or outcomes. In various examples, the scenario and/or vehicle performance data may include vehicle safety metrics such as collision rates, near-miss collision rates, speed limit or traffic violation rates, rates of excess braking or acceleration, comfort metric compliance rates and/or any data associated with the performance of the vehicle controller within the driving scenario.

In other examples, if the parameter set falls outside of the simulation region (808:No), then in operation 814 the computing device(s) 604 may update the vehicle/scenario performance data based on an expected simulation result or outcome. Accordingly, in this example, a simulation might not be executed for the parameterized scenario based on the parameterized scenario falling outside of the simulation region. Instead, the computing device(s) 604 may determine expected simulation results corresponding to a likely or probable result/outcome of the simulation, if one were to be executed for the parameterized scenario. For instance, if the driving scenario has a high overall passing rate, the expected simulation result determined in operation 814 may be a passing result. In contrast, if the driving scenario has a low overall passing rate, the expected simulation result determined in operation 814 may be a failing result. After determining the expected simulation result, the computing device(s) 604 also may update the scenario and/or vehicle performance data associated with the driving scenario, based on the expected simulation results and/or outcomes.

At operation 816, the computing device(s) 604 may output the scenario and/or vehicle performance data associated with the driving scenario. For example, a scenario/vehicle performance component 408 may aggregate the simulation results for any parameter scenarios executed as simulations in operation 810, with the expected simulation results determined in operation 814 for parameter scenarios not executed as simulations. In some cases, process 800 may return multiple times to operation 806 to that multiple parameter sets are selected and evaluated using sampling-based techniques as described above. The associated vehicle safety metrics output in operation 816 (e.g., collision rates, traffic violation rates, rates of excess braking or acceleration, comfort metric compliance rates, etc.) thus may be based on any number of sampled parameter sets, including hundreds, thousands, or millions of parameter sets.

As these examples illustrate, the techniques described herein may use comparisons against the simulation region(s) to determine which parameterized scenarios to execute as simulations, and which to use expected simulation results instead. These techniques thus may save computing resources within the computing device(s) 604 by not requiring generation and execution of simulations outside of the simulation region, which may have a higher degree of result certainty and are less likely to identify additional scenario failures. Additionally, the computing device(s) 604 may generate and execute a greater number of simulations within the simulation region, whose results are less certain, thereby providing more relevant simulation result data and improved accuracy for the scenario performance/vehicle safety metrics.

Example Clauses

A. A system comprising: one or more processors; and one or more non-transitory computer-readable media storing computer-executable instructions that, when executed, cause the system to perform operations comprising: receiving scenario data including a parameter space associated with a driving scenario, the parameter space including a first parameter range associated with a first scenario parameter, and a second parameter range associated with a second scenario parameter; determining, based at least in part on a failed simulation of the driving scenario, a simulation region within the parameter space, wherein the simulation region includes a first subrange of the first parameter range and a second subrange of the second parameter range; receiving a first set of scenario parameters, including a first value associated with the first scenario parameter and a second value associated with the second scenario parameter; determining that the first set of scenario parameters is within the simulation region, by comparing the first value to the first subrange and comparing the second value to the second subrange; determining a first simulation result by executing a first simulation of the driving scenario using the first set of scenario parameters, wherein executing the first simulation is based at least in part on determining that the first set of scenario parameters is within the simulation region; and determining a vehicle safety metric associated with the driving scenario, based at least in part on the first simulation result.

B. The system as recited in paragraph A, the operations further comprising: receiving a second set of scenario parameters, including a third value associated with the first scenario parameter and a fourth value associated with the second scenario parameter; determining that the second set of scenario parameters is outside the simulation region, by comparing the third value to the first subrange and comparing the fourth value to the second subrange; and determining a second result associated with the second set of scenario parameters, based at least in part on determining that the second set of scenario parameters is outside the simulation region, wherein the second result is based on an expected simulation result associated with the parameter space.

C. The system as recited in paragraph B, wherein: receiving the first set of scenario parameters comprises determining the first value and the second value by a first sampling from a joint distribution associated with the first scenario parameter and the second scenario parameter; and receiving the second set of scenario parameters comprises determining the third value and the fourth value by a second sampling from the joint distribution.

D. The system as recited in paragraph B, wherein determining the simulation region comprises: determining a third set of scenario parameters associated with the failed simulation of the driving scenario; determining a fourth set of scenario parameters associated with a second failed simulation of the driving scenario; determining the first subrange of the first parameter range based at least in part on a value of the first scenario parameter within the third set of scenario parameters, and a value of the first scenario parameter within the fourth set of scenario parameters; and determining the second subrange of the second parameter range based at least in part on a value of the second scenario parameter within the third set of scenario parameters, and a value of the second scenario parameter within the fourth set of scenario parameters.

E. The system as recited in paragraph B, wherein determining the simulation region comprises: using a Bayesian optimization algorithm to determine a third set of scenario parameters associated with the failed simulation of the driving scenario; and using the Bayesian optimization algorithm to determine a fourth set of scenario parameters associated with a passing simulation of the driving scenario, wherein the simulation region comprises a region within the parameter space bounded by the fourth set of scenario parameters and encompassing the third set of scenario parameters.

F. A method comprising: receiving data identifying a parameter space associated with a scenario, the parameter space defined by a parameter range of a scenario parameter; determining a region within the parameter space, based at least in part on a scenario failure, the region including a subrange of the parameter range; receiving a set of scenario parameters, including a value associated with the scenario parameter; determining that the set of scenario parameters is within the region, by comparing the value to the subrange; and executing, based at least in part on determining that the set of scenario parameters is within the region, a first simulation of the scenario using the set of scenario parameters to determine a first simulation result.

G. The method of paragraph F, further comprising: receiving an additional set of scenario parameters, including an additional value associated with the scenario parameter; determining that the additional set of scenario parameters is outside the region, by comparing the additional value to the subrange; and determining an additional result associated with the additional set of scenario parameters, based at least in part on determining that the additional set of scenario parameters is outside the region, wherein the additional result is based on an expected simulation result associated with the parameter space.

H. The method of paragraph G, further comprising: determining a performance metric associated with the scenario, based at least in part on the first simulation result and the additional result.

I. The method of paragraph G, wherein: receiving the set of scenario parameters comprises determining the value by sampling from a distribution associated with the scenario parameter; and receiving the additional set of scenario parameters comprises determining the additional value by sampling from the distribution.

J. The method of paragraph F, wherein determining the region comprises: determining an additional set of scenario parameters associated with the scenario failure; and determining the subrange of the parameter range based at least in part on a value of the scenario parameter within the additional set of scenario parameters.

K. The method of paragraph F, wherein determining the region comprises: determining an additional set of scenario parameters, using a Bayesian optimization algorithm; executing a second simulation of the scenario using the additional set of scenario parameters; determining that the second simulation comprises the scenario failure; and determining the region based at least in part on the additional set of scenario parameters.

L. The method of paragraph F, further comprising: determining an additional region within the parameter space, wherein the additional region is non-overlapping with the region, receiving an additional set of scenario parameters; comparing the additional set of scenario parameters to the region and to the additional region; and executing, based at least in part on determining that the additional set of scenario parameters is within either the region or the additional region, a second simulation of the scenario using the additional set of scenario parameters.

M. The method of paragraph F, wherein the scenario comprises a first driving scenario, wherein the executing the first simulation comprises instantiating a simulated vehicle in the first driving scenario, and wherein the method further comprises: determining a vehicle safety metric based at least in part on the first simulation result; and controlling an autonomous vehicle within an environment based at least in part on the vehicle safety metric.

N. One or more non-transitory computer-readable media storing processor-executable instructions that, when executed by one or more processors, cause the one or more processors to perform operations comprising: receiving data identifying a parameter space associated with a scenario, the parameter space defined by a parameter range of a scenario parameter; determining a region within the parameter space, based at least in part on a scenario failure, the region including a subrange of the parameter range; receiving a set of scenario parameters, including a value associated with the scenario parameter; determining that the set of scenario parameters is within the region, by comparing the value to the subrange; and executing, based at least in part on determining that the set of scenario parameters is within the region, a first simulation of the scenario using the set of scenario parameters to determine a first simulation result.

O. The one or more non-transitory computer-readable media of paragraph N, the operations further comprising: receiving an additional set of scenario parameters, including an additional value associated with the scenario parameter; determining that the additional set of scenario parameters is outside the region, by comparing the additional value to the subrange; and determining an additional result associated with the additional set of scenario parameters, based at least in part on determining that the additional set of scenario parameters is outside the region, wherein the additional result is based on an expected simulation result associated with the parameter space.

P. The one or more non-transitory computer-readable media of paragraph O, the operations further comprising: determining a performance metric associated with the scenario, based at least in part on the first simulation result and the additional result.

Q. The one or more non-transitory computer-readable media of paragraph O, wherein: receiving the set of scenario parameters comprises determining the value by sampling from a distribution associated with the scenario parameter; and receiving the additional set of scenario parameters comprises determining the additional value by sampling from the distribution.

R. The one or more non-transitory computer-readable media of paragraph N, wherein determining an additional set of scenario parameters associated with the scenario failure; and determining the subrange of the parameter range based at least in part on a value of the scenario parameter within the additional set of scenario parameters.

S. The one or more non-transitory computer-readable media of paragraph N, wherein determining the region comprises: determining an additional set of scenario parameters, using a Bayesian optimization algorithm; executing a second simulation of the scenario using the additional set of scenario parameters; determining that the second simulation comprises the scenario failure; and determining the region based at least in part on the additional set of scenario parameters.

T. The one or more non-transitory computer-readable media of paragraph N, the operations further comprising: determining an additional region within the parameter space, wherein the additional region is non-overlapping with the region, receiving an additional set of scenario parameters; comparing the additional set of scenario parameters to the region and to the additional region; and executing, based at least in part on determining that the additional set of scenario parameters is within either the region or the additional region, a second simulation of the scenario using the additional set of scenario parameters.

While the example clauses described above are described with respect to particular implementations, it should be understood that, in the context of this document, the content of the example clauses can be implemented via a method, device, system, a computer-readable medium, and/or another implementation. Additionally, any of examples A-T may be implemented alone or in combination with any other one or more of the examples A-T.

CONCLUSION

While one or more examples of the techniques described herein have been described, various alterations, additions, permutations and equivalents thereof are included within the scope of the techniques described herein. As can be understood, the components discussed herein are described as divided for illustrative purposes. However, the operations performed by the various components can be combined or performed in any other component. It should also be understood, that components or steps discussed with respect to one example or implementation may be used in conjunction with components or steps of other examples.

A non-limiting list of objects in an environment may include but is not limited to pedestrians, animals, cyclists, trucks, motorcycles, other vehicles, or the like. Such objects in the environment have a "geometric pose" (which may also be referred to herein as merely "pose") comprising a location and/or orientation of the overall object relative to a frame of reference. In some examples, pose may be indicative of a position of an object (e.g., pedestrian), an orientation of the object, or relative appendage positions of the object. Geometric pose may be described in two-dimensions (e.g., using an x-y coordinate system) or three-dimensions (e.g., using an x-y-z or polar coordinate system), and may include an orientation (e.g., roll, pitch, and/or yaw) of the object. Some objects, such as pedestrians and animals, also have what is referred to herein as "appearance pose." Appearance pose comprises a shape and/or positioning of parts of a body (e.g., appendages, head, torso, eyes, hands, feet, etc.). As used herein, the term "pose" refers to both the "geometric pose" of an object relative to a frame of reference and, in the case of pedestrians, animals, and other objects capable of changing shape and/or positioning of parts of a body, "appearance pose." In some examples, the frame of reference is described with reference to a two- or three-dimensional coordinate system or map that describes the location of objects relative to a vehicle. However, in other examples, other frames of reference may be used.

In the description of examples, reference is made to the accompanying drawings that form a part hereof, which show by way of illustration specific examples of the claimed subject matter. It is to be understood that other examples can be used and that changes or alterations, such as structural changes, can be made. Such examples, changes or alterations are not necessarily departures from the scope with respect to the intended claimed subject matter. While the steps herein may be presented in a certain order, in some cases the ordering may be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

The components described herein represent instructions that may be stored in any type of computer-readable medium and may be implemented in software and/or hardware. All of the methods and processes described above may be embodied in, and fully automated via, software code modules and/or computer-executable instructions executed by one or more computers or processors, hardware, or some combination thereof. Some or all of the methods may alternatively be embodied in specialized computer hardware.

Conditional language such as, among others, "may," "could," "may" or "might," unless specifically stated otherwise, are understood within the context to present that certain examples include, while other examples do not include, certain features, elements and/or steps. Thus, such conditional language is not generally intended to imply that certain features, elements and/or steps are in any way required for one or more examples or that one or more examples necessarily include logic for deciding, with or without user input or prompting, whether certain features, elements and/or steps are included or are to be performed in any particular example.

Conjunctive language such as the phrase "at least one of X, Y or Z," unless specifically stated otherwise, is to be understood to present that an item, term, etc. may be either X, Y, or Z, or any combination thereof, including multiples of each element. Unless explicitly described as singular, "a" means singular and plural.

Any routine descriptions, elements or blocks in the flow diagrams described herein and/or depicted in the attached figures should be understood as potentially representing modules, segments, or portions of code that include one or more computer-executable instructions for implementing specific logical functions or elements in the routine. Alternate implementations are included within the scope of the examples described herein in which elements or functions may be deleted, or executed out of order from that shown or discussed, including substantially synchronously, in reverse order, with additional operations, or omitting operations, depending on the functionality involved as would be understood by those skilled in the art.

Many variations and modifications may be made to the above-described examples, the elements of which are to be understood as being among other acceptable examples. All such modifications and variations are intended to be included herein within the scope of this disclosure and protected by the following claims.

What is claimed is:

1. A system comprising:
one or more processors; and
one or more non-transitory computer-readable media storing computer-executable instructions that, when executed, cause the system to perform operations comprising:
receiving scenario data including a parameter space associated with a driving scenario, the parameter space including a first parameter range associated with a first scenario parameter, and a second parameter range associated with a second scenario parameter;
determining, based at least in part on a failed simulation of the driving scenario, a simulation region within the parameter space, wherein the simulation region includes a first subrange of the first parameter range and a second subrange of the second parameter range;
receiving a first set of scenario parameters, including a first value associated with the first scenario parameter and a second value associated with the second scenario parameter;
determining that the first set of scenario parameters is within the simulation region, by comparing the first value to the first subrange and comparing the second value to the second subrange;
determining a first simulation result by executing a first simulation of the driving scenario using the first set of scenario parameters, wherein executing the first simulation is based at least in part on determining that the first set of scenario parameters is within the simulation region; and
determining a vehicle safety metric associated with the driving scenario, based at least in part on the first simulation result.

2. The system as recited in claim 1, the operations further comprising:
receiving a second set of scenario parameters, including a third value associated with the first scenario parameter and a fourth value associated with the second scenario parameter;
determining that the second set of scenario parameters is outside the simulation region, by comparing the third value to the first subrange and comparing the fourth value to the second subrange; and
determining a second result associated with the second set of scenario parameters, based at least in part on determining that the second set of scenario parameters is outside the simulation region, wherein the second result is based on an expected simulation result associated with the parameter space.

3. The system as recited in claim 2, wherein:
receiving the first set of scenario parameters comprises determining the first value and the second value by a first sampling from a joint distribution associated with the first scenario parameter and the second scenario parameter; and
receiving the second set of scenario parameters comprises determining the third value and the fourth value by a second sampling from the joint distribution.

4. The system as recited in claim 2, wherein determining the simulation region comprises:
determining a third set of scenario parameters associated with the failed simulation of the driving scenario;
determining a fourth set of scenario parameters associated with a second failed simulation of the driving scenario;
determining the first subrange of the first parameter range based at least in part on a value of the first scenario parameter within the third set of scenario parameters, and a value of the first scenario parameter within the fourth set of scenario parameters; and
determining the second subrange of the second parameter range based at least in part on a value of the second scenario parameter within the third set of scenario parameters, and a value of the second scenario parameter within the fourth set of scenario parameters.

5. The system as recited in claim 2, wherein determining the simulation region comprises:
using a Bayesian optimization algorithm to determine a third set of scenario parameters associated with the failed simulation of the driving scenario; and
using the Bayesian optimization algorithm to determine a fourth set of scenario parameters associated with a passing simulation of the driving scenario,
wherein the simulation region comprises a region within the parameter space bounded by the fourth set of scenario parameters and encompassing the third set of scenario parameters.

6. A method comprising:
receiving data identifying a parameter space associated with a scenario, the parameter space defined by a parameter range of a scenario parameter;
determining a region within the parameter space, based at least in part on a scenario failure, the region including a subrange of the parameter range;
receiving a set of scenario parameters, including a value associated with the scenario parameter;
determining that the set of scenario parameters is within the region, by comparing the value to the subrange; and
executing, based at least in part on determining that the set of scenario parameters is within the region, a first simulation of the scenario using the set of scenario parameters to determine a first simulation result.

7. The method of claim 6, further comprising:
receiving an additional set of scenario parameters, including an additional value associated with the scenario parameter;
determining that the additional set of scenario parameters is outside the region, by comparing the additional value to the subrange; and
determining an additional result associated with the additional set of scenario parameters, based at least in part on determining that the additional set of scenario parameters is outside the region, wherein the additional result is based on an expected simulation result associated with the parameter space.

8. The method of claim 7, further comprising:
determining a performance metric associated with the scenario, based at least in part on the first simulation result and the additional result.

9. The method of claim 7, wherein:
receiving the set of scenario parameters comprises determining the value by sampling from a distribution associated with the scenario parameter; and
receiving the additional set of scenario parameters comprises determining the additional value by sampling from the distribution.

10. The method of claim 6, wherein determining the region comprises:
determining an additional set of scenario parameters associated with the scenario failure; and determining the subrange of the parameter range based at least in part on a value of the scenario parameter within the additional set of scenario parameters.

11. The method of claim 6, wherein determining the region comprises:
  determining an additional set of scenario parameters, using a Bayesian optimization algorithm;
  executing a second simulation of the scenario using the additional set of scenario parameters;
  determining that the second simulation comprises the scenario failure; and
  determining the region based at least in part on the additional set of scenario parameters.

12. The method of claim 6, further comprising:
  determining an additional region within the parameter space, wherein the additional region is non-overlapping with the region,
  receiving an additional set of scenario parameters;
  comparing the additional set of scenario parameters to the region and to the additional region; and
  executing, based at least in part on determining that the additional set of scenario parameters is within either the region or the additional region, a second simulation of the scenario using the additional set of scenario parameters.

13. The method of claim 6, wherein the scenario comprises a first driving scenario, wherein the executing the first simulation comprises instantiating a simulated vehicle in the first driving scenario, and wherein the method further comprises:
  determining a vehicle safety metric based at least in part on the first simulation result; and
  controlling an autonomous vehicle within an environment based at least in part on the vehicle safety metric.

14. One or more non-transitory computer-readable media storing processor-executable instructions that, when executed by one or more processors, cause the one or more processors to perform operations comprising:
  receiving data identifying a parameter space associated with a scenario, the parameter space defined by a parameter range of a scenario parameter;
  determining a region within the parameter space, based at least in part on a scenario failure, the region including a subrange of the parameter range;
  receiving a set of scenario parameters, including a value associated with the scenario parameter;
  determining that the set of scenario parameters is within the region, by comparing the value to the subrange; and
  executing, based at least in part on determining that the set of scenario parameters is within the region, a first simulation of the scenario using the set of scenario parameters to determine a first simulation result.

15. The one or more non-transitory computer-readable media of claim 14, the operations further comprising:
  receiving an additional set of scenario parameters, including an additional value associated with the scenario parameter;
  determining that the additional set of scenario parameters is outside the region, by comparing the additional value to the subrange; and
  determining an additional result associated with the additional set of scenario parameters, based at least in part on determining that the additional set of scenario parameters is outside the region, wherein the additional result is based on an expected simulation result associated with the parameter space.

16. The one or more non-transitory computer-readable media of claim 15, the operations further comprising:
  determining a performance metric associated with the scenario, based at least in part on the first simulation result and the additional result.

17. The one or more non-transitory computer-readable media of claim 15, wherein:
  receiving the set of scenario parameters comprises determining the value by sampling from a distribution associated with the scenario parameter; and
  receiving the additional set of scenario parameters comprises determining the additional value by sampling from the distribution.

18. The one or more non-transitory computer-readable media of claim 14, wherein
  determining an additional set of scenario parameters associated with the scenario failure; and
  determining the subrange of the parameter range based at least in part on a value of the scenario parameter within the additional set of scenario parameters.

19. The one or more non-transitory computer-readable media of claim 14, wherein determining the region comprises:
  determining an additional set of scenario parameters, using a Bayesian optimization algorithm;
  executing a second simulation of the scenario using the additional set of scenario parameters;
  determining that the second simulation comprises the scenario failure; and
  determining the region based at least in part on the additional set of scenario parameters.

20. The one or more non-transitory computer-readable media of claim 14, the operations further comprising:
  determining an additional region within the parameter space, wherein the additional region is non-overlapping with the region,
  receiving an additional set of scenario parameters;
  comparing the additional set of scenario parameters to the region and to the additional region; and
  executing, based at least in part on determining that the additional set of scenario parameters is within either the region or the additional region, a second simulation of the scenario using the additional set of scenario parameters.

* * * * *